United States Patent
Pendse

(10) Patent No.: US 10,388,626 B2
(45) Date of Patent: Aug. 20, 2019

(54) SEMICONDUCTOR DEVICE AND METHOD OF FORMING FLIPCHIP INTERCONNECT STRUCTURE

(75) Inventor: Rajendra D. Pendse, Fremont, CA (US)

(73) Assignee: STATS ChipPAC Pte. Ltd., Singapore (SG)

( * ) Notice: Subject to any disclaimer, the term of this patent is extended or adjusted under 35 U.S.C. 154(b) by 1588 days.

(21) Appl. No.: 12/947,414

(22) Filed: Nov. 16, 2010

(65) Prior Publication Data

US 2011/0074022 A1 Mar. 31, 2011
US 2012/0241945 A9 Sep. 27, 2012

Related U.S. Application Data

(60) Continuation-in-part of application No. 10/849,947, filed on May 20, 2004, now Pat. No. 7,994,636.
(Continued)

(51) Int. Cl.
*H01L 23/52* (2006.01)
*H01L 23/538* (2006.01)
(Continued)

(52) U.S. Cl.
CPC .......... *H01L 24/81* (2013.01); *H01L 21/565* (2013.01); *H01L 24/16* (2013.01); *H01L 24/83* (2013.01);
(Continued)

(58) Field of Classification Search
CPC ....... H01L 2924/00; H01L 2924/00014; H01L 2224/73265; H01L 2224/13111;
(Continued)

(56) References Cited

U.S. PATENT DOCUMENTS

| 3,665,590 A | 5/1972 | Percival |
| 4,208,005 A | 6/1980 | Nate et al. |

(Continued)

FOREIGN PATENT DOCUMENTS

| EP | 0352020 A2 | 1/1990 |
| JP | 01226160 | 9/1989 |

(Continued)

OTHER PUBLICATIONS

Yamada, Hiroshi et al., "Advanced copper column based solder bump for flip-chip interconnection", International Symposium on Microelectronics, 1997, pp. 417-422, The British Library—"The world's knowledge".

(Continued)

*Primary Examiner* — Mary A Wilczewski
*Assistant Examiner* — Tsz K Chiu
(74) *Attorney, Agent, or Firm* — Robert D. Atkins; Patent Law Group: Atkins and Associates, P.C.

(57) ABSTRACT

A semiconductor device has a semiconductor die with a plurality of bumps or interconnect structures formed over an active surface of the die. The bumps can have a fusible portion and non-fusible portion, such as a conductive pillar and bump formed over the conductive pillar. A plurality of conductive traces with interconnect sites is formed over a substrate. The bumps are wider than the interconnect sites. A masking layer is formed over an area of the substrate away from the interconnect sites. The bumps are bonded to the interconnect sites under pressure or reflow temperature so that the bumps cover a top surface and side surfaces of the interconnect sites. An encapsulant is deposited around the bumps between the die and substrate. The masking layer can form a dam to block the encapsulant from extending beyond the semiconductor die. Asperities can be formed over the interconnect sites or bumps.

35 Claims, 18 Drawing Sheets

Related U.S. Application Data which is a division of application No. 09/802,664, filed on Mar. 9, 2001, now Pat. No. 6,815,252.

(60) Provisional application No. 60/188,570, filed on Mar. 10, 2000.

(51) Int. Cl.

| | | |
|---|---|---|
| *H05K 3/34* | (2006.01) | |
| *H05K 3/24* | (2006.01) | |
| *H01L 23/00* | (2006.01) | |
| *H01L 21/56* | (2006.01) | |
| *H01L 23/31* | (2006.01) | |
| *H05K 3/32* | (2006.01) | |

(52) U.S. Cl.
CPC ............ *H01L 24/90* (2013.01); *H01L 21/563* (2013.01); *H01L 23/3121* (2013.01); *H01L 24/73* (2013.01); *H01L 2224/05611* (2013.01); *H01L 2224/05624* (2013.01); *H01L 2224/05639* (2013.01); *H01L 2224/05644* (2013.01); *H01L 2224/05647* (2013.01); *H01L 2224/05655* (2013.01); *H01L 2224/1134* (2013.01); *H01L 2224/13017* (2013.01); *H01L 2224/13019* (2013.01); *H01L 2224/13099* (2013.01); *H01L 2224/13109* (2013.01); *H01L 2224/13111* (2013.01); *H01L 2224/13144* (2013.01); *H01L 2224/13147* (2013.01); *H01L 2224/1601* (2013.01); *H01L 2224/16225* (2013.01); *H01L 2224/16235* (2013.01); *H01L 2224/16237* (2013.01); *H01L 2224/16238* (2013.01); *H01L 2224/27013* (2013.01); *H01L 2224/2919* (2013.01); *H01L 2224/29109* (2013.01); *H01L 2224/29111* (2013.01); *H01L 2224/32145* (2013.01); *H01L 2224/32225* (2013.01); *H01L 2224/48091* (2013.01); *H01L 2224/48227* (2013.01); *H01L 2224/48247* (2013.01); *H01L 2224/73204* (2013.01); *H01L 2224/73265* (2013.01); *H01L 2224/81141* (2013.01); *H01L 2224/81191* (2013.01); *H01L 2224/81193* (2013.01); *H01L 2224/81345* (2013.01); *H01L 2224/81385* (2013.01); *H01L 2224/81801* (2013.01); *H01L 2224/838* (2013.01); *H01L 2224/83192* (2013.01); *H01L 2924/014* (2013.01); *H01L 2924/0105* (2013.01); *H01L 2924/01005* (2013.01); *H01L 2924/01006* (2013.01); *H01L 2924/01013* (2013.01); *H01L 2924/01029* (2013.01); *H01L 2924/0132* (2013.01); *H01L 2924/01032* (2013.01); *H01L 2924/01033* (2013.01); *H01L 2924/0133* (2013.01); *H01L 2924/01047* (2013.01); *H01L 2924/01049* (2013.01); *H01L 2924/01061* (2013.01); *H01L 2924/01074* (2013.01); *H01L 2924/01078* (2013.01); *H01L 2924/01079* (2013.01); *H01L 2924/01082* (2013.01); *H01L 2924/01322* (2013.01); *H01L 2924/0665* (2013.01); *H01L 2924/12041* (2013.01); *H01L 2924/12042* (2013.01); *H01L 2924/1306* (2013.01); *H01L 2924/13091* (2013.01); *H01L 2924/14* (2013.01); *H01L 2924/1433* (2013.01); *H01L 2924/15311* (2013.01); *H01L 2924/181* (2013.01); *H01L 2924/19041* (2013.01); *H05K 3/325* (2013.01)

(58) Field of Classification Search
CPC . H01L 2224/32225; H01L 2224/16225; H01L 24/81; H01L 24/90; H01L 24/83; H01L 21/565; H01L 24/16; H01L 24/73; H01L 2224/13017; H01L 2224/13019; H01L 2224/05624; H01L 2224/05647; H01L 2224/05611; H01L 2224/05655; H01L 2224/05644; H01L 2224/05639; H01L 2224/16235; H01L 2224/27013; H01L 2224/73204; H01L 2224/13109; H01L 2224/29109; H01L 2224/29111; H01L 2224/81385; H01L 2224/1601; H01L 2224/81193; H01L 2224/81141; H01L 2224/81345

USPC ......... 257/737, 738, 778, E21.508, E21.511, 257/E23.021

See application file for complete search history.

(56) References Cited

U.S. PATENT DOCUMENTS

| | | | |
|---|---|---|---|
| 4,813,129 A | 3/1989 | Karnezos | |
| 5,011,066 A | 4/1991 | Thompson | |
| 5,210,938 A | 5/1993 | Hirai | |
| 5,219,117 A | 6/1993 | Lin | |
| 5,250,469 A | 10/1993 | Tanaka et al. | |
| 5,323,035 A | 6/1994 | Leedy | |
| 5,346,857 A | 9/1994 | Scharr et al. | |
| 5,378,859 A | 1/1995 | Shirasaki et al. | |
| 5,386,624 A | 2/1995 | George et al. | |
| 5,434,410 A | 7/1995 | Kulwicki | |
| 5,508,561 A * | 4/1996 | Tago et al. | 257/737 |
| 5,519,580 A | 5/1996 | Natarajan et al. | |
| 5,592,736 A * | 1/1997 | Akram et al. | 29/841 |
| 5,634,267 A | 6/1997 | Farnworth et al. | |
| 5,650,595 A * | 7/1997 | Bentlage | H01L 23/5386 |
| | | | 174/260 |
| 5,686,317 A | 11/1997 | Akram et al. | |
| 5,705,858 A | 1/1998 | Tsukamoto | |
| 5,710,071 A | 1/1998 | Beddingfield | |
| 5,714,252 A | 2/1998 | Hogerton et al. | |
| 5,717,477 A | 2/1998 | Fritz et al. | |
| 5,755,909 A | 5/1998 | Gailus | |
| 5,801,350 A | 9/1998 | Shibuya et al. | |
| 5,802,699 A | 9/1998 | Fjelstad et al. | |
| 5,829,126 A | 11/1998 | Nagao et al. | |
| 5,844,782 A | 12/1998 | Fukasawa | |
| 5,865,365 A | 2/1999 | Nishikawa et al. | |
| 5,869,886 A | 2/1999 | Tokuno | |
| 5,869,904 A | 2/1999 | Shoji | |
| 5,872,051 A | 2/1999 | Fallon | |
| 5,872,399 A | 2/1999 | Lee | |
| 5,874,780 A | 2/1999 | Murakami | |
| 5,879,530 A | 3/1999 | Caillat | |
| 5,889,326 A * | 3/1999 | Tanaka | 257/737 |
| 5,892,289 A | 4/1999 | Tokuno | |
| 5,915,169 A | 6/1999 | Heo | |
| 5,931,371 A | 8/1999 | Pao et al. | |
| 5,940,729 A | 8/1999 | Downes, Jr. et al. | |
| 5,952,840 A * | 9/1999 | Farnworth et al. | 324/756.05 |
| 5,953,814 A | 9/1999 | Sozansky et al. | |
| 5,985,456 A | 11/1999 | Zhou et al. | |
| 6,037,192 A | 3/2000 | Witzman et al. | |
| 6,037,707 A | 3/2000 | Gailus et al. | |
| 6,053,395 A | 4/2000 | Sasaki | |
| 6,084,781 A | 7/2000 | Klein | |
| 6,100,597 A | 8/2000 | Nakamura | |
| 6,121,143 A | 9/2000 | Messner et al. | |
| 6,130,476 A | 10/2000 | LaFontaine, Jr. et al. | |
| 6,137,184 A * | 10/2000 | Ikegami | H01L 21/4853 |
| | | | 257/734 |
| 6,153,940 A | 11/2000 | Zakel et al. | |
| 6,173,887 B1 | 1/2001 | Mead et al. | |
| 6,181,569 B1 * | 1/2001 | Chakravorty | 361/761 |
| 6,189,208 B1 | 2/2001 | Estes et al. | |
| 6,194,781 B1 | 2/2001 | Ikegami | |
| 6,201,305 B1 | 3/2001 | Darveaux et al. | |
| 6,214,642 B1 | 4/2001 | Chen et al. | |

(56) References Cited

U.S. PATENT DOCUMENTS

| | | |
|---|---|---|
| 6,218,630 B1 | 4/2001 | Takigami |
| 6,225,144 B1 | 5/2001 | How et al. |
| 6,228,466 B1 | 5/2001 | Tsukada et al. |
| 6,229,209 B1 * | 5/2001 | Nakamura et al. ............ 257/737 |
| 6,259,163 B1 | 7/2001 | Ohuchi et al. |
| 6,281,450 B1 | 8/2001 | Urasaki et al. |
| 6,297,560 B1 | 10/2001 | Capote et al. |
| 6,324,754 B1 | 12/2001 | DiStefano et al. |
| 6,326,234 B1 | 12/2001 | Nakamura |
| 6,329,605 B1 | 12/2001 | Beroz et al. |
| 6,335,568 B1 | 1/2002 | Yuzawa et al. |
| 6,335,571 B1 | 1/2002 | Capote et al. |
| 6,337,522 B1 | 1/2002 | Kang et al. |
| 6,374,487 B1 | 4/2002 | Haba et al. |
| 6,396,707 B1 | 5/2002 | Huang et al. |
| 6,426,636 B1 | 7/2002 | Das et al. |
| 6,441,316 B1 | 8/2002 | Kusui |
| 6,448,665 B1 | 9/2002 | Nakazawa et al. |
| 6,483,195 B1 | 11/2002 | Aoki et al. |
| 6,573,610 B1 | 6/2003 | Tsai |
| 6,600,234 B2 | 7/2003 | Kuwabara et al. |
| 6,608,388 B2 | 8/2003 | Lin et al. |
| 6,710,458 B2 | 3/2004 | Seko |
| 6,781,247 B2 | 8/2004 | Shibata |
| 6,818,545 B2 | 11/2004 | Lee et al. |
| 6,822,336 B2 | 11/2004 | Kurita |
| 6,893,901 B2 | 5/2005 | Madrid |
| 6,909,180 B2 * | 6/2005 | Ono ................. H01L 21/563 257/734 |
| 7,242,099 B2 | 7/2007 | Lin et al. |
| 7,271,497 B2 | 9/2007 | Joshi et al. |
| 7,576,427 B2 | 8/2009 | Potter |
| 7,758,351 B2 | 7/2010 | Brown et al. |
| 7,902,679 B2 | 3/2011 | Lin et al. |
| 2001/0005047 A1 * | 6/2001 | Jimarez et al. ............... 257/687 |
| 2001/0013423 A1 * | 8/2001 | Dalal et al. ................... 174/260 |
| 2001/0026010 A1 | 10/2001 | Horiuchi et al. |
| 2001/0055835 A1 | 12/2001 | Pendse |
| 2002/0117330 A1 * | 8/2002 | Eldridge et al. .............. 174/260 |
| 2002/0142516 A1 * | 10/2002 | Light ............................ 438/107 |
| 2003/0001253 A1 | 1/2003 | Kurita |
| 2004/0108581 A1 * | 6/2004 | Li .................................. 257/678 |
| 2004/0201074 A1 * | 10/2004 | Khandros et al. ............ 257/459 |
| 2005/0056933 A1 * | 3/2005 | Chung .......................... 257/737 |
| 2005/0110164 A1 | 5/2005 | Pendse |
| 2005/0279916 A1 * | 12/2005 | Kang et al. ................ 250/208.1 |
| 2005/0287706 A1 * | 12/2005 | Fuller et al. .................. 438/108 |
| 2006/0216860 A1 | 9/2006 | Pendse |
| 2007/0145548 A1 * | 6/2007 | Park et al. .................... 257/678 |
| 2008/0213941 A1 | 9/2008 | Pendse |
| 2009/0128172 A1 | 5/2009 | Takaki et al. |
| 2010/0252316 A1 | 10/2010 | Oda |
| 2011/0111591 A1 | 5/2011 | Do et al. |
| 2011/0241203 A1 | 10/2011 | Nakasato et al. |
| 2012/0098123 A1 * | 4/2012 | Yu et al. ....................... 257/737 |
| 2014/0347084 A1 | 11/2014 | Hu et al. |

FOREIGN PATENT DOCUMENTS

| | | |
|---|---|---|
| JP | 02067742 | 3/1990 |
| JP | 03006828 | 1/1991 |
| JP | 04-355933 | 9/1992 |
| JP | H0669373 A | 3/1994 |
| JP | 07086346 | 3/1995 |
| JP | 07115097 | 5/1995 |
| JP | H07122846 A | 5/1995 |
| JP | 07142488 | 6/1995 |
| JP | 07201917 | 8/1995 |
| JP | 07283268 | 10/1995 |
| JP | 09097816 | 4/1997 |
| JP | 09-237802 A | 9/1997 |
| JP | 09275125 | 10/1997 |
| JP | 10050765 | 2/1998 |
| JP | 10-098075 | 4/1998 |
| JP | 10-256307 | 9/1998 |
| JP | 11186324 | 7/1999 |
| JP | 11204913 | 7/1999 |
| JP | 2000-031204 | 1/2000 |
| JP | 2002134541 A | 5/2002 |
| JP | 2004-221205 | 5/2004 |
| JP | 2007511103 A | 4/2007 |
| JP | 2007214230 A | 8/2007 |
| TW | 200723355 | 6/2007 |
| TW | 200915510 | 4/2009 |
| WO | 2009090896 A1 | 7/2009 |
| WO | 2010067610 A1 | 6/2010 |

OTHER PUBLICATIONS

Yamada, Hiroshi et al., "A fine pitch and high aspect ratio bump array for flip-chip interconnection", Int'l Electronics Manufacturing Technology Symposium, 1992, pp. 288-292, IEEE/CHMT.

Son, Ho Young et al., "Studies on the Thermal Cycling Reliability of Fine Pitch Cu/SnAg Double-Bump Flip Chip Assemblies on Organic Substrates: Experimental Results and Numerical Analysis", Electronic Components and Technology Conference, 2008, pp. 2035-2043.

Lu, H. et al., "Predicting Optimal Process Conditions for Flip-Chip Assembly Using Copper Column Bumped Dies", Electronics Packaging Technology Conference, 2002, pp. 338-343.

Kawahara, Toshimi, "SuperCSP", IEEE Transactions on Advanced Packaging, May 2000, pp. 215-219, vol. 23, No. 2.

* cited by examiner

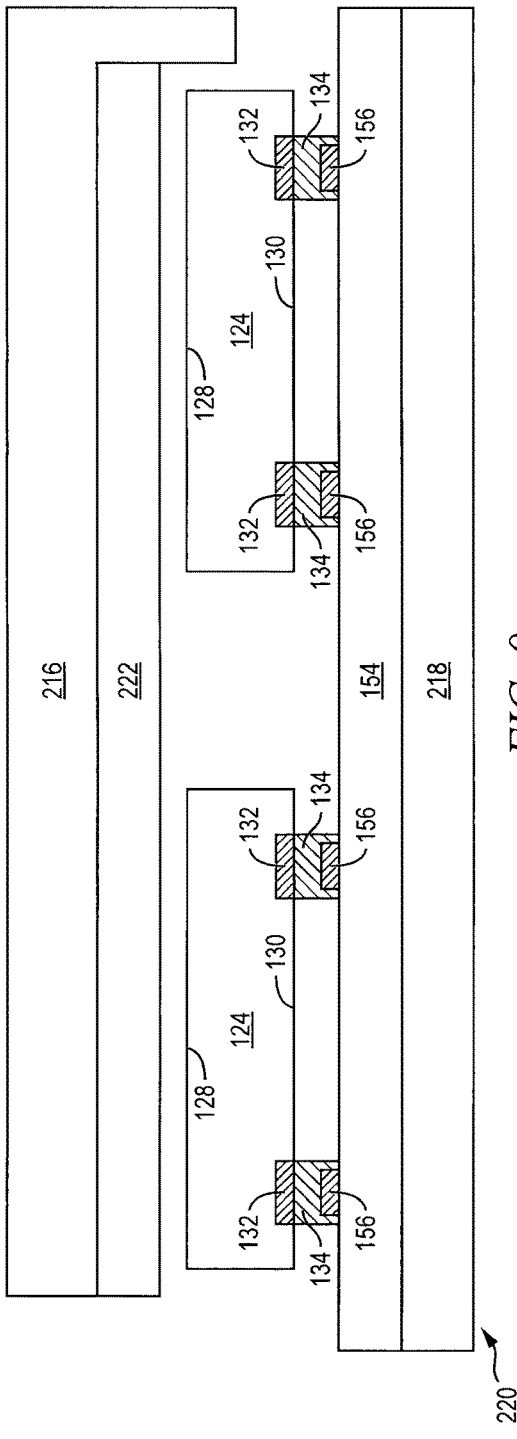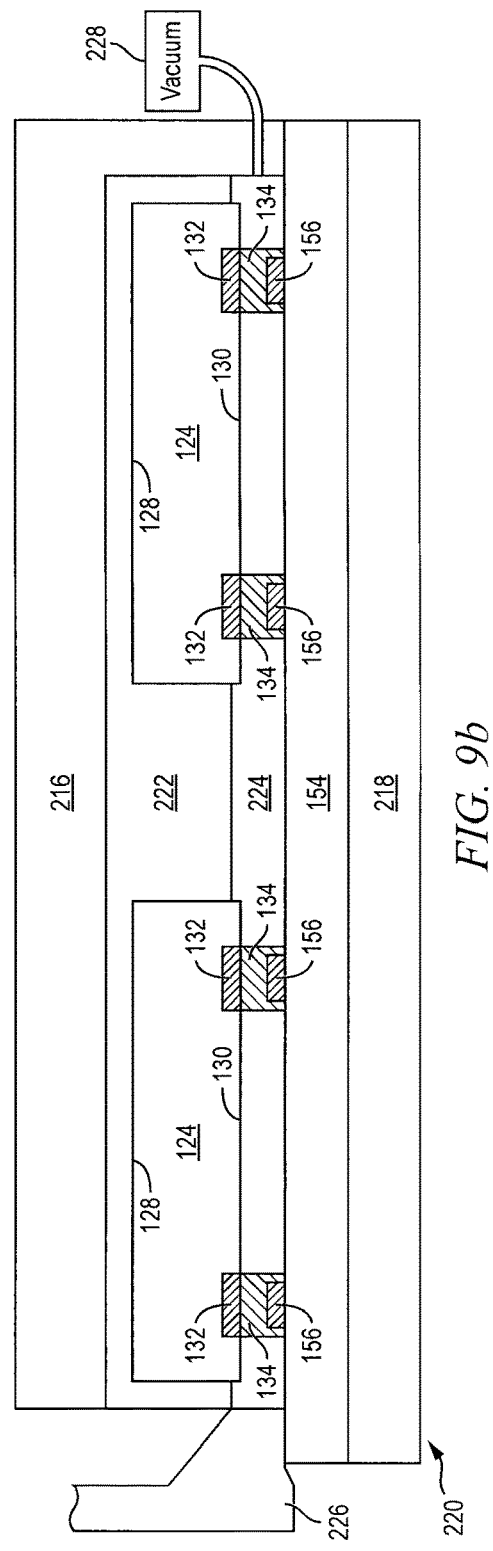

SEMICONDUCTOR DEVICE AND METHOD OF FORMING FLIPCHIP INTERCONNECT STRUCTURE

CLAIM TO DOMESTIC PRIORITY

The present application is a continuation-in-part of U.S. patent application Ser. No. 10/849,947, filed May 20, 2004, now U.S. Pat. No. 7,994,636, which is a division of U.S. patent application Ser. No. 09/802,664, filed Mar. 9, 2001, now U.S. Pat. No. 6,815,252, which claims the benefit of U.S. Provisional Application No. 60/188,570, filed Mar. 10, 2000.

FIELD OF THE INVENTION

The present invention relates in general to semiconductor devices and, more particularly, to a semiconductor device and method of forming a flipchip interconnect structure.

BACKGROUND OF THE INVENTION

Semiconductor devices are commonly found in modern electronic products. Semiconductor devices vary in the number and density of electrical components. Discrete semiconductor devices generally contain one type of electrical component, e.g., light emitting diode (LED), small signal transistor, resistor, capacitor, inductor, and power metal oxide semiconductor field effect transistor (MOSFET). Integrated semiconductor devices typically contain hundreds to millions of electrical components. Examples of integrated semiconductor devices include microcontrollers, microprocessors, charged-coupled devices (CCDs), solar cells, and digital micro-mirror devices (DMDs).

Semiconductor devices perform a wide range of functions such as signal processing, high-speed calculations, transmitting and receiving electromagnetic signals, controlling electronic devices, transforming sunlight to electricity, and creating visual projections for television displays. Semiconductor devices are found in the fields of entertainment, communications, power conversion, networks, computers, and consumer products. Semiconductor devices are also found in military applications, aviation, automotive, industrial controllers, and office equipment.

Semiconductor devices exploit the electrical properties of semiconductor materials. The atomic structure of semiconductor material allows its electrical conductivity to be manipulated by the application of an electric field or base current or through the process of doping. Doping introduces impurities into the semiconductor material to manipulate and control the conductivity of the semiconductor device.

A semiconductor device contains active and passive electrical structures. Active structures, including bipolar and field effect transistors, control the flow of electrical current. By varying levels of doping and application of an electric field or base current, the transistor either promotes or restricts the flow of electrical current. Passive structures, including resistors, capacitors, and inductors, create a relationship between voltage and current necessary to perform a variety of electrical functions. The passive and active structures are electrically connected to form circuits, which enable the semiconductor device to perform high-speed calculations and other useful functions.

Semiconductor devices are generally manufactured using two complex manufacturing processes, i.e., front-end manufacturing, and back-end manufacturing, each involving potentially hundreds of steps. Front-end manufacturing involves the formation of a plurality of die on the surface of a semiconductor wafer. Each die is typically identical and contains circuits formed by electrically connecting active and passive components. Back-end manufacturing involves singulating individual die from the finished wafer and packaging the die to provide structural support and environmental isolation.

One goal of semiconductor manufacturing is to produce smaller semiconductor devices. Smaller devices typically consume less power, have higher performance, and can be produced more efficiently. In addition, smaller semiconductor devices have a smaller footprint, which is desirable for smaller end products. A smaller die size may be achieved by improvements in the front-end process resulting in die with smaller, higher density active and passive components. Back-end processes may result in semiconductor device packages with a smaller footprint by improvements in electrical interconnection and packaging materials.

A flipchip interconnection between a semiconductor die and substrate is commonly found in an electronic package assembly. In the most common form, the interconnection bumps on the semiconductor die are metallurgically joined to pads formed over the substrate, usually by melting of the bump material using a reflow process. While the reflow of the bump material provides robust connections, it is difficult to reduce the pitch of the interconnection due to the risk of bridging, i.e., shorting between adjacent connections, during the reflow and solidification processes. In an alternative approach, the attachment is made using a particulate film or paste, whereby conductive particles in the paste or film together with the shrinkage force of a resin effect an electrical connection. The particulate film approach lends itself to reduction of interconnection pitch but suffers from limited long term reliability owing to the susceptibility of the particulate interconnection to degrade over time.

SUMMARY OF THE INVENTION

A need exists to form reliable and robust interconnect joints between a semiconductor die and substrate in fine pitch applications. Accordingly, in one embodiment, the present invention is a method of making a semiconductor device comprising the steps of providing a semiconductor die having a plurality of bumps formed over an active surface of the semiconductor die, providing a substrate, and forming a plurality of conductive traces with interconnect sites over the substrate. The bumps are wider than the interconnect sites. The method further includes the steps of forming a masking layer over an area of the substrate away from the interconnect sites, bonding the bumps to the interconnect sites so that the bumps cover a top surface and side surfaces of the interconnect sites, and depositing an encapsulant around the bumps between the semiconductor die and substrate.

In another embodiment, the present invention is a method of making a semiconductor device comprising the steps of providing a semiconductor die having a plurality of interconnect structures formed over a surface of the semiconductor die, providing a substrate, forming a plurality of conductive traces with interconnect sites over the substrate, bonding the interconnect structures to the interconnect sites absent a mask opening so that the interconnect structures cover a top surface and side surfaces of the interconnect sites, and depositing an encapsulant around the interconnect structures between the semiconductor die and substrate. The interconnect structures are wider than the interconnect sites.

In another embodiment, the present invention is a method of making a semiconductor device comprising the steps of providing a semiconductor die having a plurality of interconnect structures formed over a surface of the semiconductor die, providing a substrate, forming a plurality of conductive traces with interconnect sites over the substrate, and bonding the interconnect structures to the interconnect sites absent a mask opening so that the interconnect structures cover a top surface and side surfaces of the interconnect sites. The interconnect sites are narrower than the interconnect structures.

In another embodiment, the present invention is a semiconductor device comprising a semiconductor die having a plurality of interconnect structures formed over a surface of the semiconductor die. A plurality of conductive traces with interconnect sites is formed over a substrate. The interconnect sites are narrower than the interconnect structures. The interconnect structures are bonded to the interconnect sites so that the interconnect structures cover a top surface and side surfaces of the interconnect sites. An encapsulant is deposited around the interconnect structures between the semiconductor die and substrate.

BRIEF DESCRIPTION OF THE DRAWINGS

FIGS. 9a-9c illustrate mold underfill between the semiconductor die and substrate;

DETAILED DESCRIPTION OF THE DRAWINGS

Figure 1:
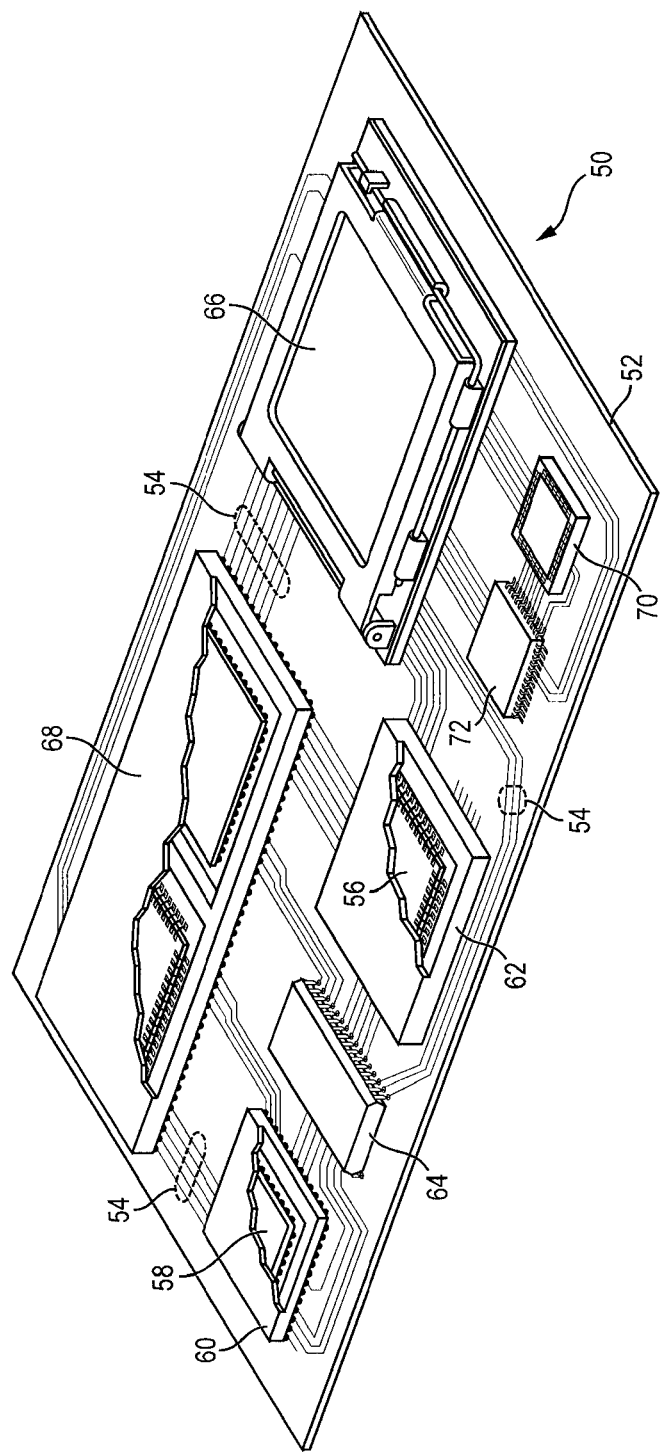
FIG. 1 illustrates a PCB with different types of packages mounted to its surface.

The present invention is described in one or more embodiments in the following description with reference to the figures, in which like numerals represent the same or similar elements. While the invention is described in terms of the best mode for achieving the invention's objectives, it will be appreciated by those skilled in the art that it is intended to cover alternatives, modifications, and equivalents as may be included within the spirit and scope of the invention as defined by the appended claims and their equivalents as supported by the following disclosure and drawings.

Semiconductor devices are generally manufactured using two complex manufacturing processes: front-end manufacturing and back-end manufacturing. Front-end manufacturing involves the formation of a plurality of die on the surface of a semiconductor wafer. Each die on the wafer contains active and passive electrical components, which are electrically connected to form functional electrical circuits. Active electrical components, such as transistors and diodes, have the ability to control the flow of electrical current. Passive electrical components, such as capacitors, inductors, resistors, and transformers, create a relationship between voltage and current necessary to perform electrical circuit functions.

Passive and active components are formed over the surface of the semiconductor wafer by a series of process steps including doping, deposition, photolithography, etching, and planarization. Doping introduces impurities into the semiconductor material by techniques such as ion implantation or thermal diffusion. The doping process modifies the electrical conductivity of semiconductor material in active devices, transforming the semiconductor material into an insulator, conductor, or dynamically changing the semiconductor material conductivity in response to an electric field or base current. Transistors contain regions of varying types and degrees of doping arranged as necessary to enable the transistor to promote or restrict the flow of electrical current upon the application of the electric field or base current.

Active and passive components are formed by layers of materials with different electrical properties. The layers can be formed by a variety of deposition techniques determined in part by the type of material being deposited. For example, thin film deposition may involve chemical vapor deposition (CVD), physical vapor deposition (PVD), electrolytic plating, and electroless plating processes. Each layer is generally patterned to form portions of active components, passive components, or electrical connections between components.

The layers can be patterned using photolithography, which involves the deposition of light sensitive material, e.g., photoresist, over the layer to be patterned. A pattern is transferred from a photomask to the photoresist using light. The portion of the photoresist pattern subjected to light is removed using a solvent, exposing portions of the underlying layer to be patterned. The remainder of the photoresist is removed, leaving behind a patterned layer. Alternatively, some types of materials are patterned by directly depositing the material into the areas or voids formed by a previous deposition/etch process using techniques such as electroless and electrolytic plating.

Depositing a thin film of material over an existing pattern can exaggerate the underlying pattern and create a non-uniformly flat surface. A uniformly flat surface is required to produce smaller and more densely packed active and passive components. Planarization can be used to remove material from the surface of the wafer and produce a uniformly flat surface. Planarization involves polishing the surface of the wafer with a polishing pad. An abrasive material and corrosive chemical are added to the surface of the wafer during polishing. The combined mechanical action of the abrasive and corrosive action of the chemical removes any irregular topography, resulting in a uniformly flat surface.

Back-end manufacturing refers to cutting or singulating the finished wafer into the individual die and then packaging the die for structural support and environmental isolation. To singulate the die, the wafer is scored and broken along non-functional regions of the wafer called saw streets or scribes. The wafer is singulated using a laser cutting tool or saw blade. After singulation, the individual die are mounted to a package substrate that includes pins or contact pads for interconnection with other system components. Contact pads formed over the semiconductor die are then connected to contact pads within the package. The electrical connections can be made with solder bumps, stud bumps, conductive paste, or wirebonds. An encapsulant or other molding material is deposited over the package to provide physical support and electrical isolation. The finished package is then inserted into an electrical system and the functionality of the semiconductor device is made available to the other system components.

FIG. 1 illustrates electronic device 50 having a chip carrier substrate or printed circuit board (PCB) 52 with a plurality of semiconductor packages mounted on its surface. Electronic device 50 may have one type of semiconductor package, or multiple types of semiconductor packages, depending on the application. The different types of semiconductor packages are shown in FIG. 1 for purposes of illustration.

Electronic device 50 may be a stand-alone system that uses the semiconductor packages to perform one or more electrical functions. Alternatively, electronic device 50 may be a subcomponent of a larger system. For example, electronic device 50 may be part of a cellular phone, personal digital assistant (PDA), digital video camera (DVC), or other electronic communication device. Alternatively, electronic device 50 can be a graphics card, network interface card, or other signal processing card that can be inserted into a computer. The semiconductor package can include microprocessors, memories, application specific integrated circuits (ASIC), logic circuits, analog circuits, RF circuits, discrete devices, or other semiconductor die or electrical components. The miniaturization and the weight reduction are essential for these products to be accepted by the market. The distance between semiconductor devices must be decreased to achieve higher density.

In FIG. 1, PCB 52 provides a general substrate for structural support and electrical interconnect of the semiconductor packages mounted on the PCB. Conductive signal traces 54 are formed over a surface or within layers of PCB 52 using evaporation, electrolytic plating, electroless plating, screen printing, or other suitable metal deposition process. Signal traces 54 provide for electrical communication between each of the semiconductor packages, mounted components, and other external system components. Traces 54 also provide power and ground connections to each of the semiconductor packages.

In some embodiments, a semiconductor device has two packaging levels. First level packaging is a technique for mechanically and electrically attaching the semiconductor die to an intermediate carrier. Second level packaging involves mechanically and electrically attaching the intermediate carrier to the PCB. In other embodiments, a semiconductor device may only have the first level packaging where the die is mechanically and electrically mounted directly to the PCB.

For the purpose of illustration, several types of first level packaging, including wire bond package 56 and flip chip 58, are shown on PCB 52. Additionally, several types of second level packaging, including ball grid array (BGA) 60, bump chip carrier (BCC) 62, dual in-line package (DIP) 64, land grid array (LGA) 66, multi-chip module (MCM) 68, quad flat non-leaded package (QFN) 70, and quad flat package 72, are shown mounted on PCB 52. Depending upon the system requirements, any combination of semiconductor packages, configured with any combination of first and second level packaging styles, as well as other electronic components, can be connected to PCB 52. In some embodiments, electronic device 50 includes a single attached semiconductor package, while other embodiments call for multiple interconnected packages. By combining one or more semiconductor packages over a single substrate, manufacturers can incorporate pre-made components into electronic devices and systems. Because the semiconductor packages include sophisticated functionality, electronic devices can be manufactured using cheaper components and a streamlined manufacturing process. The resulting devices are less likely to fail and less expensive to manufacture resulting in a lower cost for consumers.

Figure 2A:
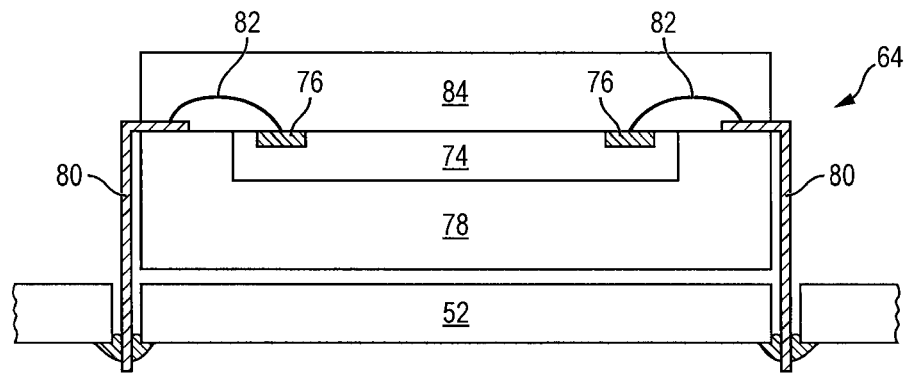
FIGS. 2a-2c illustrate further detail of the semiconductor packages mounted to the PCB.
Figure 2B:
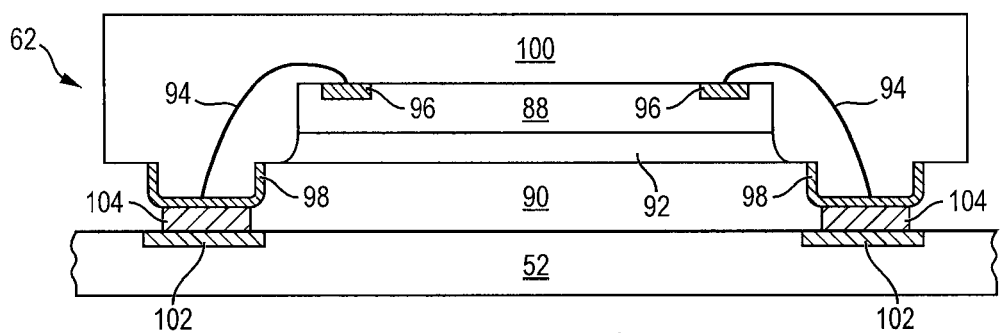
Figure 2C:
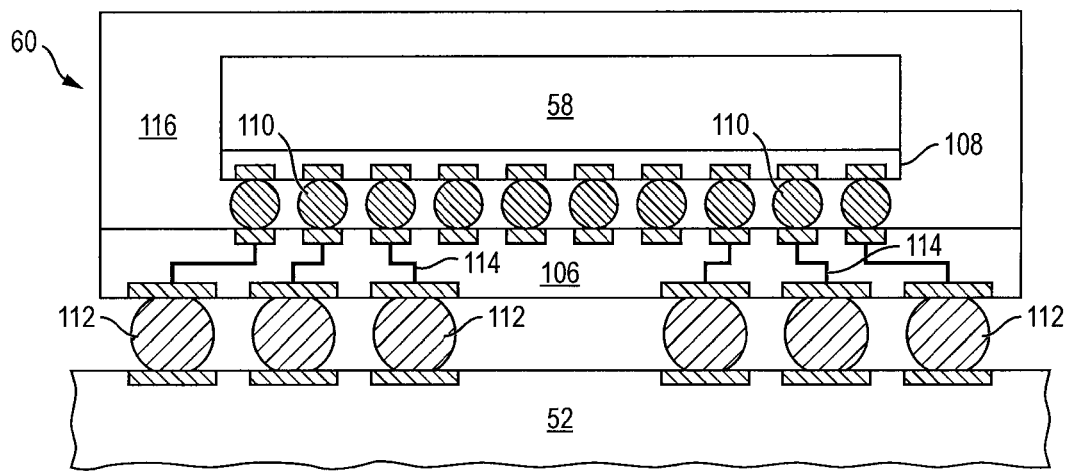

FIGS. 2a-2c show exemplary semiconductor packages. FIG. 2a illustrates further detail of DIP 64 mounted on PCB 52. Semiconductor die 74 includes an active region containing analog or digital circuits implemented as active devices, passive devices, conductive layers, and dielectric layers formed within the die and are electrically interconnected according to the electrical design of the die. For example, the circuit may include one or more transistors, diodes, inductors, capacitors, resistors, and other circuit elements formed within the active region of semiconductor die 74. Contact pads 76 are one or more layers of conductive material, such as aluminum (Al), copper (Cu), tin (Sn), nickel (Ni), gold (Au), or silver (Ag), and are electrically connected to the circuit elements formed within semiconductor die 74. During assembly of DIP 64, semiconductor die 74 is mounted to an intermediate carrier 78 using a gold-silicon eutectic layer or adhesive material such as thermal epoxy or epoxy resin. The package body includes an insulative packaging material such as polymer or ceramic. Conductor leads 80 and bond wires 82 provide electrical interconnect between semiconductor die 74 and PCB 52. Encapsulant 84 is deposited over the package for environmental protection by preventing moisture and particles from entering the package and contaminating die 74 or bond wires 82.

FIG. 2b illustrates further detail of BCC 62 mounted on PCB 52. Semiconductor die 88 is mounted over carrier 90 using an underfill or epoxy-resin adhesive material 92. Bond wires 94 provide first level packaging interconnect between contact pads 96 and 98. Molding compound or encapsulant 100 is deposited over semiconductor die 88 and bond wires 94 to provide physical support and electrical isolation for the device. Contact pads 102 are formed over a surface of PCB 52 using a suitable metal deposition process such as electrolytic plating or electroless plating to prevent oxidation. Contact pads 102 are electrically connected to one or more conductive signal traces 54 in PCB 52. Bumps 104 are formed between contact pads 98 of BCC 62 and contact pads 102 of PCB 52.

In FIG. 2c, semiconductor die 58 is mounted face down to intermediate carrier 106 with a flip chip style first level packaging. Active region 108 of semiconductor die 58 contains analog or digital circuits implemented as active devices, passive devices, conductive layers, and dielectric layers formed according to the electrical design of the die. For example, the circuit may include one or more transistors, diodes, inductors, capacitors, resistors, and other circuit elements within active region 108. Semiconductor die 58 is electrically and mechanically connected to carrier 106 through bumps 110.

BGA 60 is electrically and mechanically connected to PCB 52 with a BGA style second level packaging using bumps 112. Semiconductor die 58 is electrically connected to conductive signal traces 54 in PCB 52 through bumps 110, signal lines 114, and bumps 112. A molding compound or encapsulant 116 is deposited over semiconductor die 58 and carrier 106 to provide physical support and electrical isolation for the device. The flip chip semiconductor device provides a short electrical conduction path from the active devices on semiconductor die 58 to conduction tracks on PCB 52 in order to reduce signal propagation distance, lower capacitance, and improve overall circuit performance. In another embodiment, the semiconductor die 58 can be mechanically and electrically connected directly to PCB 52 using flip chip style first level packaging without intermediate carrier 106.

Figure 3A:
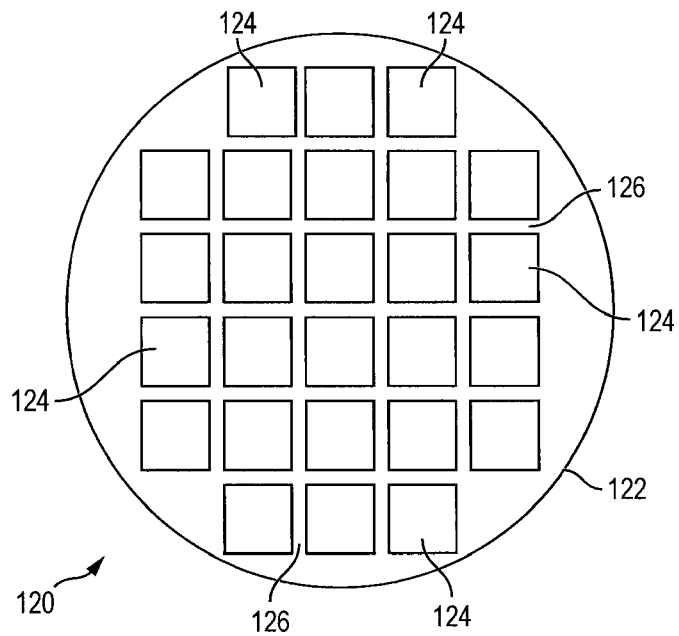
FIGS. 3a-3h illustrate various interconnect structures formed over a semiconductor die for bonding to conductive traces on a substrate.

FIG. 3a shows a semiconductor wafer 120 with a base substrate material 122, such as silicon, germanium, gallium arsenide, indium phosphide, or silicon carbide, for structural support. A plurality of semiconductor die or components 124 is formed on wafer 120 separated by saw streets 126 as described above.

Figure 3B:
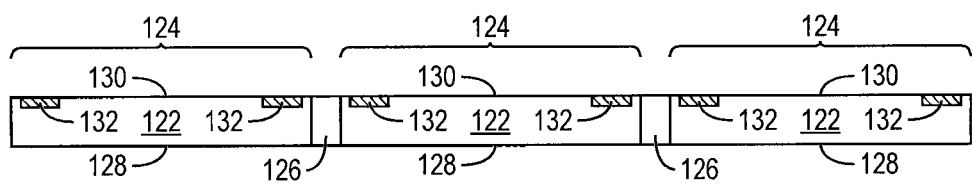

FIG. 3b shows a cross-sectional view of a portion of semiconductor wafer 120. Each semiconductor die 124 has a back surface 128 and active surface 130 containing analog or digital circuits implemented as active devices, passive devices, conductive layers, and dielectric layers formed within the die and electrically interconnected according to the electrical design and function of the die. For example, the circuit may include one or more transistors, diodes, and other circuit elements formed within active surface 130 to implement analog circuits or digital circuits, such as digital signal processor (DSP), ASIC, memory, or other signal processing circuit. Semiconductor die 124 may also contain integrated passive devices (IPDs), such as inductors, capacitors, and resistors, for RF signal processing. In one embodiment, semiconductor die 124 is a flipchip type semiconductor die.

An electrically conductive layer 132 is formed over active surface 130 using PVD, CVD, electrolytic plating, electroless plating process, or other suitable metal deposition process. Conductive layer 132 can be one or more layers of Al, Cu, Sn, Ni, Au, Ag, or other suitable electrically conductive material. Conductive layer 132 operates as contact pads electrically connected to the circuits on active surface 130.

Figure 3C:
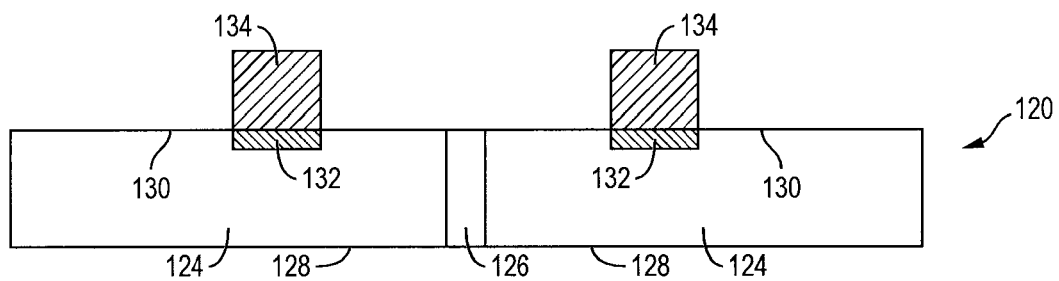
Figure 3D:
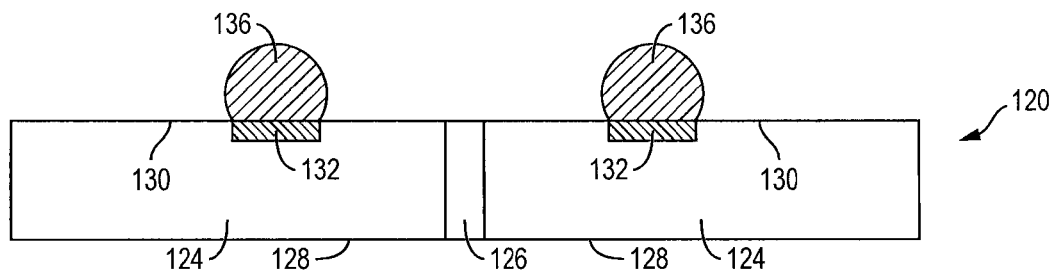

FIG. 3c shows a portion of semiconductor wafer 120 with an interconnect structure formed over contact pads 132. An electrically conductive bump material 134 is deposited over contact pads 132 using an evaporation, electrolytic plating, electroless plating, ball drop, or screen printing process. Bump material 134 can be Al, Sn, Ni, Au, Ag, Pb, Bi, Cu, solder, and combinations thereof, with an optional flux solution. For example, bump material 134 can be eutectic Sn/Pb, high-lead solder, or lead-free solder. Bump material 134 is generally compliant and undergoes plastic deformation greater than about 25 micrometers (μm) under a force equivalent to a vertical load of about 250 grams. Bump material 134 is bonded to contact pad 132 using a suitable attachment or bonding process. For example, bump material 134 can be compression bonded to contact pad 132. Bump material 134 can also be reflowed by heating the material above its melting point to form spherical balls or bumps 136, as shown in FIG. 3d. In some applications, bumps 136 are reflowed a second time to improve electrical contact to contact pad 132. Bumps 136 represent one type of interconnect structure that can be formed over contact pad 132. The interconnect structure can also use stud bump, micro bump, or other electrical interconnect.

Figure 3E:
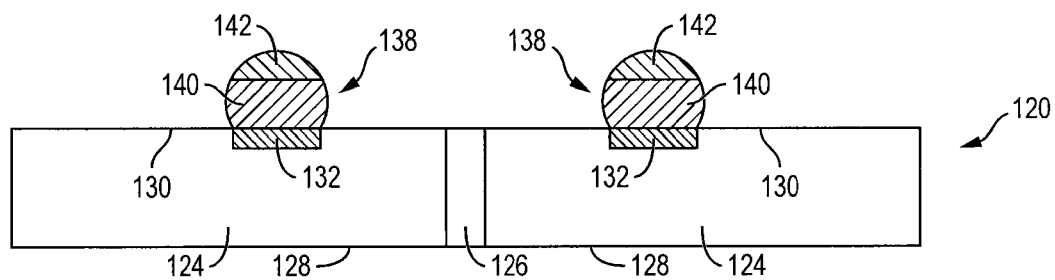

FIG. 3e shows another embodiment of the interconnect structure formed over contact pads 132 as composite bumps 138 including a non-fusible or non-collapsible portion 140 and fusible or collapsible portion 142. The fusible or collapsible and non-fusible or non-collapsible attributes are defined for bumps 138 with respect to reflow conditions. The non-fusible portion 140 can be Au, Cu, Ni, high-lead solder, or lead-tin alloy. The fusible portion 142 can be Sn, lead-free alloy, Sn—Ag alloy, Sn—Ag—Cu alloy, Sn—Ag-indium (In) alloy, eutectic solder, tin alloys with Ag, Cu, or Pb, or other relatively low temperature melt solder. In one embodiment, given a contact pad 132 width or diameter of 100 μm, the non-fusible portion 140 is about 45 μm in height and fusible portion 142 is about 35 μm in height.

Figure 3F:
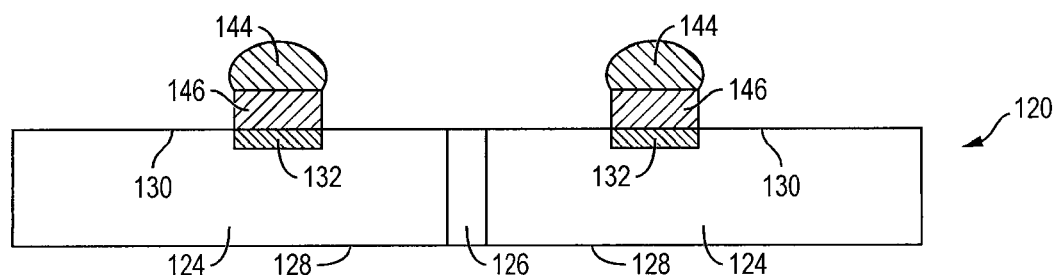

FIG. 3f shows another embodiment of the interconnect structure formed over contact pads 132 as bump 144 over conductive pillar 146. Bump 144 is fusible or collapsible and conductive pillar 146 is non-fusible or non-collapsible. The fusible or collapsible and non-fusible or non-collapsible attributes are defined with respect to reflow conditions. Bump 144 can be Sn, lead-free alloy, Sn—Ag alloy, Sn—Ag—Cu alloy, Sn—Ag—In alloy, eutectic solder, tin alloys with Ag, Cu, or Pb, or other relatively low temperature melt solder. Conductive pillar 146 can be Au, Cu, Ni, high-lead solder, or lead-tin alloy. In one embodiment, conductive pillar 146 is a Cu pillar and bump 144 is a solder cap. Given a contact pad 132 width or diameter of 100 μm, conductive pillar 146 is about 45 μm in height and bump 144 is about 35 μm in height.

Figure 3G:
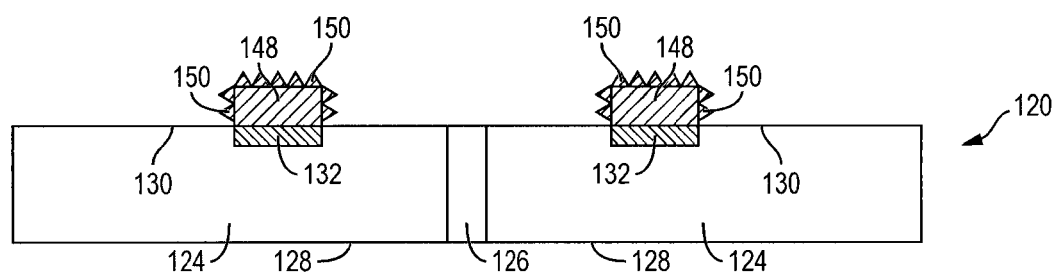

FIG. 3g shows another embodiment of the interconnect structure formed over contact pads 132 as bump material 148 with asperities 150. Bump material 148 is soft and deformable under reflow conditions with a low yield strength and high elongation to failure, similar to bump material 134. Asperities 150 are formed with a plated surface finish and are shown exaggerated in the figures for purposes of illustration. The scale of asperities 150 is generally in the order about 1-25 μm. The asperities can also be formed on bump 136, composite bump 138, and bump 144.

Figure 3H:
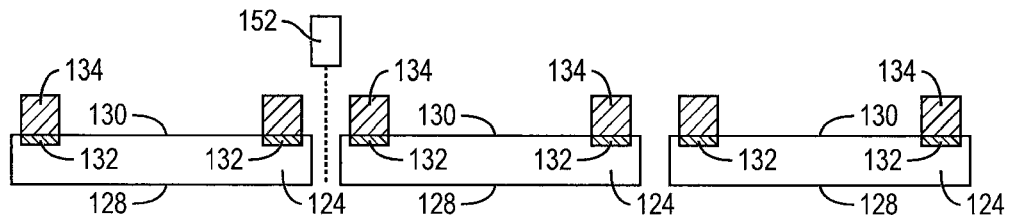

In FIG. 3h, semiconductor wafer 120 is singulated through saw street 126 using a saw blade or laser cutting tool 152 into individual semiconductor die 124.

Figure 4A:
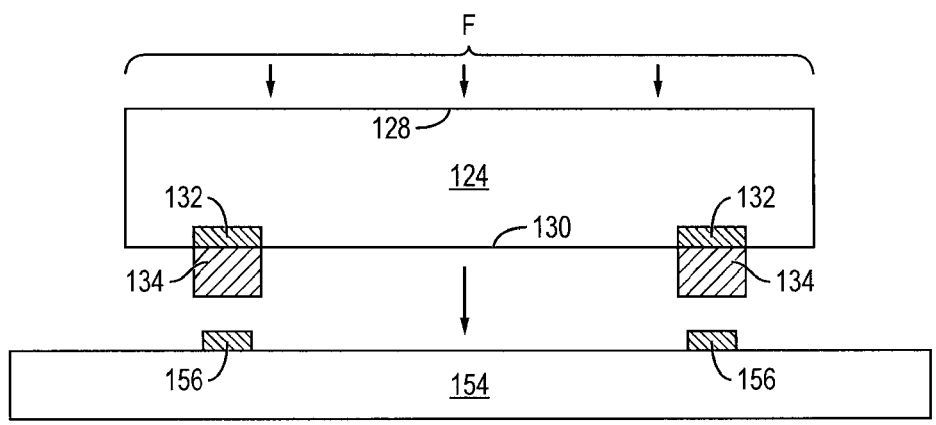
FIGS. 4a-4g illustrate the semiconductor die and interconnect structure bonded to the conductive traces.
Figure 4B:
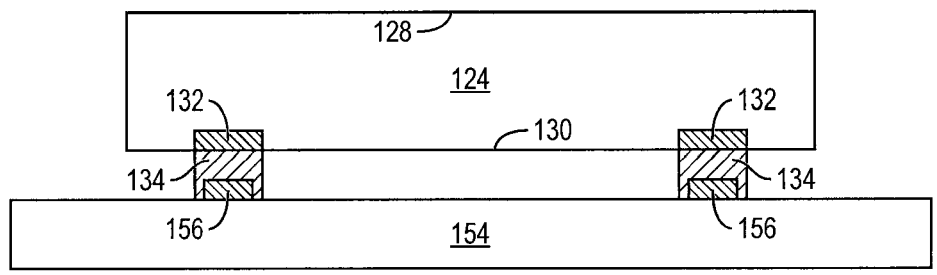

FIG. 4a shows a substrate or PCB 154 with conductive trace 156. Substrate 154 can be a single-sided FR5 laminate or 2-sided BT-resin laminate. Semiconductor die 124 is positioned so that bump material 134 is aligned with an interconnect site on conductive trace 156, see FIGS. 12a-12g. Alternatively, bump material 134 can be aligned with a conductive pad or other interconnect site formed on substrate 154. Bump material 134 is wider than conductive trace 156. In one embodiment, bump material 134 has a width of 80 μm and conductive trace or pad 156 has a width of 35 μm for a bump pitch of 150 μm. A pressure or force F is applied to back surface 128 of semiconductor die 124 to press bump material 134 onto conductive trace 156. The force F can be applied with an elevated temperature. Due to the compliant nature of bump material 134, the bump material deforms or extrudes around the top surface and side surfaces of conductive trace 156, referred to as bump-on-lead (BOL). In particular, the application of pressure causes bump material 134 to undergo a plastic deformation greater than about 25 μm under force F equivalent to a vertical load of about 250 grams and cover the top surface and side surfaces of the conductive trace, as shown in FIG. 4b. Bump material 134 can also be metallurgically connected to conductive trace 156 by bringing the bump material in physical contact with the conductive trace and then reflowing the bump material under a reflow temperature.

By making conductive trace 156 narrower than bump material 134, the conductive trace pitch can be reduced to increase routing density and I/O count. The narrower conductive trace 156 reduces the force F needed to deform bump material 134 around the conductive trace. For example, the requisite force F may be 30-50% of the force needed to deform bump material against a conductive trace or pad that is wider than the bump material. The lower compressive force F is useful for fine pitch interconnect and small die to maintain coplanarity with a specified tolerance and achieve uniform z-direction deformation and high reliability interconnect union. In addition, deforming bump material 134 around conductive trace 156 mechanically locks the bump to the trace to prevent die shifting or die floating during reflow.

Figure 4C:
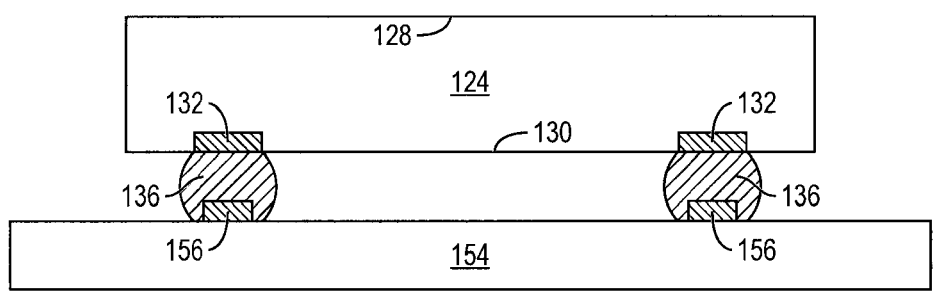

FIG. 4c shows bump 136 formed over contact pad 132 of semiconductor die 124. Semiconductor die 124 is positioned so that bump 136 is aligned with an interconnect site on conductive trace 156. Alternatively, bump 136 can be aligned with a conductive pad or other interconnect site formed on substrate 154. Bump 136 is wider than conductive trace 156. A pressure or force F is applied to back surface 128 of semiconductor die 124 to press bump 136 onto conductive trace 156. The force F can be applied with an elevated temperature. Due to the compliant nature of bump 136, the bump deforms or extrudes around the top surface and side surfaces of conductive trace 156. In particular, the application of pressure causes bump material 136 to undergo a plastic deformation and cover the top surface and side surfaces of conductive trace 156. Bump 136 can also be metallurgically connected to conductive trace 156 by bringing the bump in physical contact with the conductive trace under reflow temperature.

By making conductive trace 156 narrower than bump 136, the conductive trace pitch can be reduced to increase routing density and I/O count. The narrower conductive trace 156 reduces the force F needed to deform bump 136 around the conductive trace. For example, the requisite force F may be 30-50% of the force needed to deform a bump against a conductive trace or pad that is wider than the bump. The lower compressive force F is useful for fine pitch interconnect and small die to maintain coplanarity within a specified tolerance and achieve uniform z-direction deformation and high reliability interconnect union. In addition, deforming bump 136 around conductive trace 156 mechanically locks the bump to the trace to prevent die shifting or die floating during reflow.

Figure 4D:
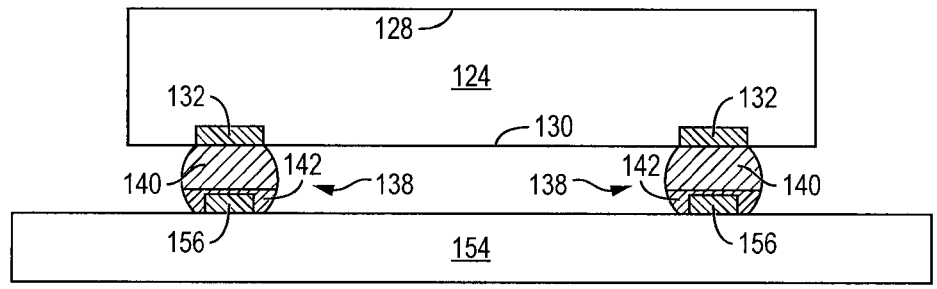

FIG. 4d shows composite bump 138 formed over contact pad 132 of semiconductor die 124. Semiconductor die 124 is positioned so that composite bump 138 is aligned with an interconnect site on conductive trace 156. Alternatively, composite bump 138 can be aligned with a conductive pad or other interconnect site formed on substrate 154. Composite bump 138 is wider than conductive trace 156. A pressure or force F is applied to back surface 128 of semiconductor die 124 to press fusible portion 142 onto conductive trace 156. The force F can be applied with an elevated temperature. Due to the compliant nature of fusible portion 142, the fusible portion deforms or extrudes around the top surface and side surfaces of conductive trace 156. In particular, the application of pressure causes fusible portion 142 to undergo a plastic deformation and cover the top surface and side surfaces of conductive trace 156. Composite bump 138 can also be metallurgically connected to conductive trace 156 by bringing fusible portion 142 in physical contact with the conductive trace under reflow temperature. The non-fusible portion 140 does not melt or deform during the application of pressure or temperature and retains its height and shape as a vertical standoff between semiconductor die 124 and substrate 154. The additional displacement between semiconductor die 124 and substrate 154 provides greater coplanarity tolerance between the mating surfaces.

During a reflow process, a large number (e.g., thousands) of composite bumps 138 on semiconductor die 124 are attached to interconnect sites on conductive trace 156 of substrate 154. Some of the bumps 138 may fail to properly connect to conductive trace 156, particularly if die 124 is warped. Recall that composite bump 138 is wider than conductive trace 156. With a proper force applied, the fusible portion 142 deforms or extrudes around the top surface and side surfaces of conductive trace 156 and mechanically locks composite bump 138 to the conductive trace. The mechanical interlock is formed by nature of the fusible portion 142 being softer and more compliant than conductive trace 156 and therefore deforming over the top surface and around the side surfaces of the conductive trace for greater contact surface area. The mechanical interlock between composite bump 138 and conductive trace 156 holds the bump to the conductive trace during reflow, i.e., the bump and conductive trace do not lose contact. Accordingly, composite bump 138 mating to conductive trace 156 reduces bump interconnect failures.

Figure 4E:
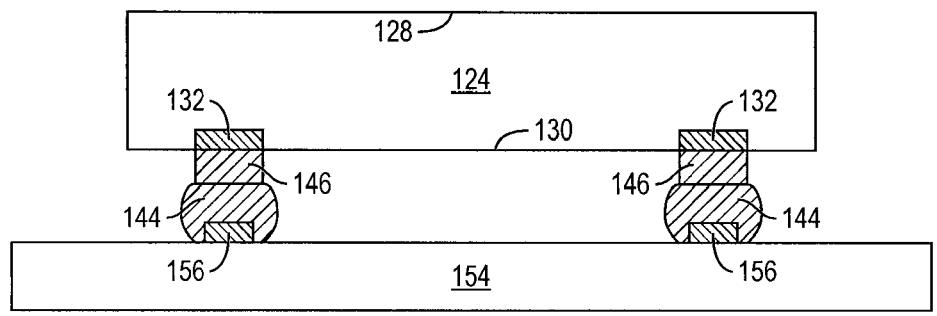

FIG. 4e shows conductive pillar 146 and bump 144 formed over contact pad 132 of semiconductor die 124. Semiconductor die 124 is positioned so that bump 144 is aligned with an interconnect site on conductive trace 156. Alternatively, bump 144 can be aligned with a conductive pad or other interconnect site formed on substrate 154. Bump 144 is wider than conductive trace 156. A pressure or force F is applied to back surface 128 of semiconductor die 124 to press bump 144 onto conductive trace 156. The force F can be applied with an elevated temperature. Due to the compliant nature of bump 144, the bump deforms or extrudes around the top surface and side surfaces of conductive trace 156. In particular, the application of pressure causes bump 144 to undergo a plastic deformation and cover the top surface and side surfaces of conductive trace 156. Conductive pillar 146 and bump 144 can also be metallurgically connected to conductive trace 156 by bringing the bump in physical contact with the conductive trace under reflow temperature. Conductive pillar 146 does not melt or deform during the application of pressure or temperature and retains its height and shape as a vertical standoff between semiconductor die 124 and substrate 154. The additional displacement between semiconductor die 124 and substrate 154 provides greater coplanarity tolerance between the mating surfaces. The wider bump 144 and narrower conductive trace 156 have similar low requisite compressive force and mechanical locking features and advantages described above for bump material 134 and bump 136.

Figure 4F:
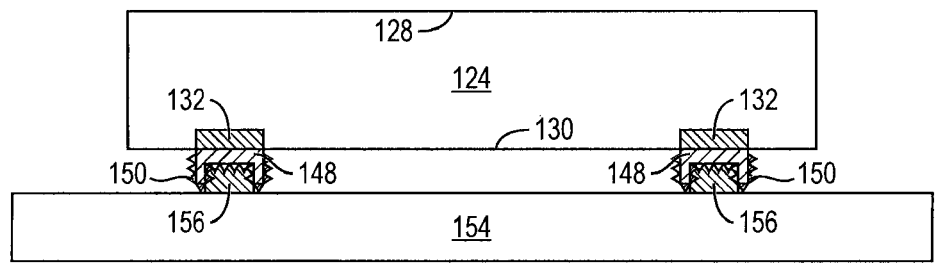

FIG. 4f shows bump material 148 with asperities 150 formed over contact pad 132 of semiconductor die 124. Semiconductor die 124 is positioned so that bump material 148 is aligned with an interconnect site on conductive trace 156. Alternatively, bump material 148 can be aligned with a conductive pad or other interconnect site formed on substrate 154. Bump material 148 is wider than conductive trace 156. A pressure or force F is applied to back surface 128 of semiconductor die 124 to press bump material 148 onto conductive trace 156. The force F can be applied with an elevated temperature. Due to the compliant nature of bump material 148, the bump deforms or extrudes around the top surface and side surfaces of conductive trace 156. In particular, the application of pressure causes bump material 148 to undergo a plastic deformation and cover the top surface and side surfaces of conductive trace 156. In addition, asperities 150 are metallurgically connected to conductive trace 156. Asperities 150 are sized on the order about 1-25 µm.

Figure 4G:
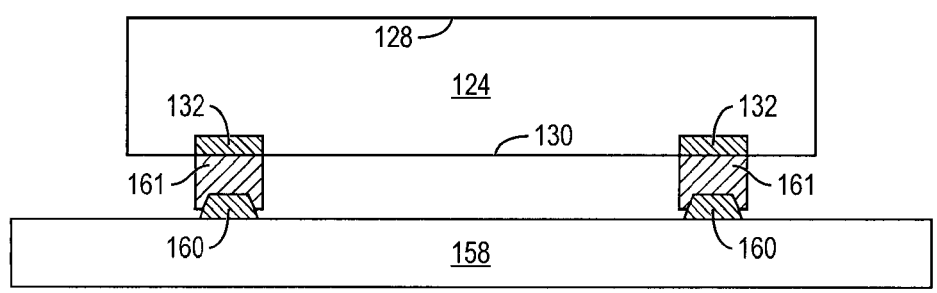

FIG. 4g shows a substrate or PCB 158 with trapezoidal conductive trace 160 having angled or sloped sides. Bump material 161 is formed over contact pad 132 of semiconductor die 124. Semiconductor die 124 is positioned so that bump material 161 is aligned with an interconnect site on conductive trace 160. Alternatively, bump material 161 can be aligned with a conductive pad or other interconnect site formed on substrate 158. Bump material 161 is wider than conductive trace 160. A pressure or force F is applied to back surface 128 of semiconductor die 124 to press bump material 161 onto conductive trace 160. The force F can be applied with an elevated temperature. Due to the compliant nature of bump material 161, the bump material deforms or extrudes around the top surface and side surfaces of conductive trace 160. In particular, the application of pressure causes bump material 161 to undergo a plastic deformation under force F to cover the top surface and the angled side surfaces of conductive trace 160. Bump material 161 can also be metallurgically connected to conductive trace 160 by bringing the bump material in physical contact with the conductive trace and then reflowing the bump material under a reflow temperature.

FIGS. 5a-5d show a BOL embodiment of semiconductor die 124 and elongated composite bump 162 having a non-fusible or non-collapsible portion 164 and fusible or collapsible portion 166. The non-fusible portion 164 can be Au, Cu, Ni, high-lead solder, or lead-tin alloy. The fusible portion 166 can be Sn, lead-free alloy, Sn—Ag alloy, Sn—Ag—Cu alloy, Sn—Ag—In alloy, eutectic solder, tin alloys with Ag, Cu, or Pb, or other relatively low temperature melt solder. The non-fusible portion 164 makes up a larger part of composite bump 162 than the fusible portion 166. The non-fusible portion 164 is fixed to contact pad 132 of semiconductor die 124.

Figure 5A:
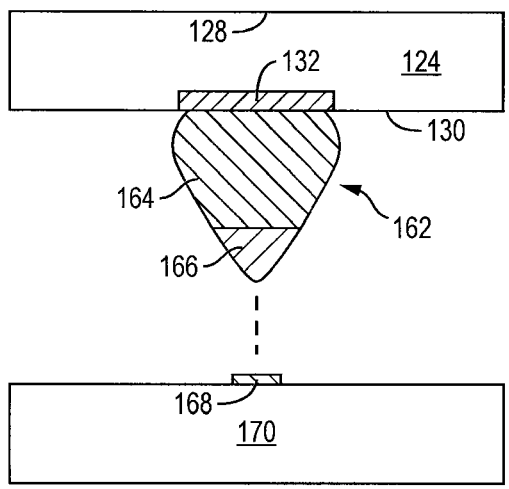
FIGS. 5a-5d illustrate the semiconductor die with a wedge-shaped interconnect structure bonded to the conductive traces.
Figure 5B:
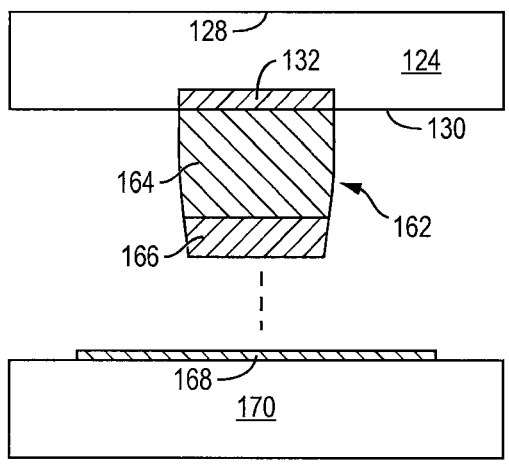
Figure 5C:
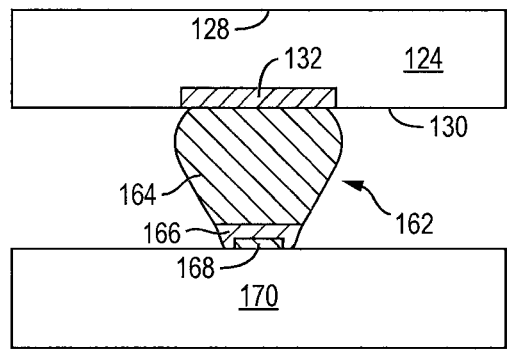
Figure 5D:
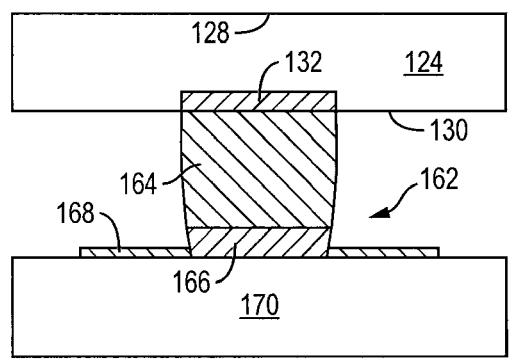

Semiconductor die 124 is positioned so that composite bump 162 is aligned with an interconnect site on conductive trace 168 formed on substrate 170, as shown in FIG. 5a. Composite bump 162 is tapered along conductive trace 168, i.e., the composite bump has a wedge shape, longer along a length of conductive trace 168 and narrower across the conductive trace. The tapered aspect of composite bump 162 occurs along the length of conductive trace 168. The view in FIG. 5a shows the shorter aspect or narrowing taper co-linear with conductive trace 168. The view in FIG. 5b, normal to FIG. 5a, shows the longer aspect of the wedge-shaped composite bump 162. The shorter aspect of composite bump 162 is wider than conductive trace 168. The fusible portion 166 collapses around conductive trace 168 upon application of pressure and/or reflow with heat, as shown in FIGS. 5c and 5d. The non-fusible portion 164 does not melt or deform during reflow and retains its form and shape. The non-fusible portion 164 can be dimensioned to provide a standoff distance between semiconductor die 124 and substrate 170. A finish such as Cu OSP can be applied to substrate 170.

During a reflow process, a large number (e.g., thousands) of composite bumps 162 on semiconductor die 124 are attached to interconnect sites on conductive trace 168 of substrate 170. Some of the bumps 162 may fail to properly connect to conductive trace 168, particularly if semiconductor die 124 is warped. Recall that composite bump 162 is wider than conductive trace 168. With a proper force applied, the fusible portion 166 deforms or extrudes around the top surface and side surfaces of conductive trace 168 and mechanically locks composite bump 162 to the conductive trace. The mechanical interlock is formed by nature of the fusible portion 166 being softer and more compliant than conductive trace 168 and therefore deforming around the top surface and side surfaces of the conductive trace for greater contact area. The wedge-shape of composite bump 162 increases contact area between the bump and conductive trace, e.g., along the longer aspect of FIGS. 5b and 5d, without sacrificing pitch along the shorter aspect of FIGS. 5a and 5c. The mechanical interlock between composite bump 162 and conductive trace 168 holds the bump to the conductive trace during reflow, i.e., the bump and conductive trace do not lose contact. Accordingly, composite bump 162 mating to conductive trace 168 reduces bump interconnect failures.

FIGS. 6a-6d show a BOL embodiment of semiconductor die 124 with bump material 174 formed over contact pads 132, similar to FIG. 3c. Bump material 174 is generally compliant and undergoes plastic deformation greater than about 25 µm under a force equivalent to a vertical load of about 250 grams. Bump material 174 is wider than conductive trace 176 on substrate 178. A plurality of asperities 180 is formed on conductive trace 176 with a height on the order about 1-25 µm.

Figure 6A:
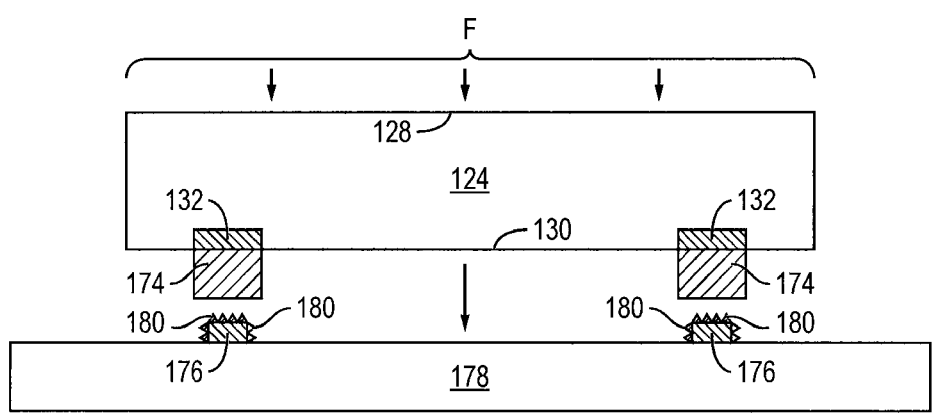
FIGS. 6a-6d illustrate another embodiment of the semiconductor die and interconnect structure bonded to the conductive traces.
Figure 6B:
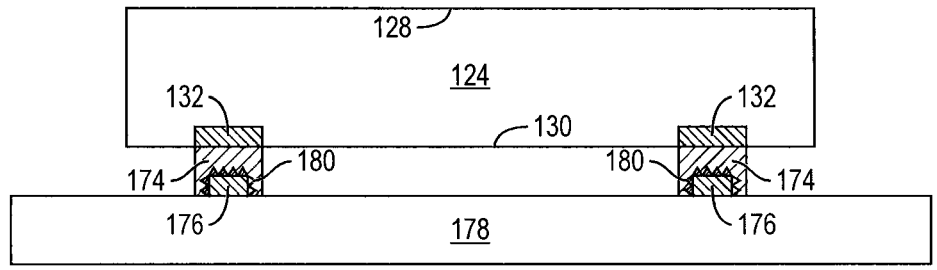

In FIG. 6a, semiconductor die 124 is positioned so that bump material 174 is aligned with an interconnect site on conductive trace 176. Alternatively, bump material 174 can be aligned with a conductive pad or other interconnect site formed on substrate 178. A pressure or force F is applied to back surface 128 of semiconductor die 124 to press bump material 174 onto conductive trace 176 and asperities 180, as shown in FIG. 6b. The force F can be applied with an elevated temperature. Due to the compliant nature of bump material 174, the bump material deforms or extrudes around the top surface and side surfaces of conductive trace 176 and asperities 180. In particular, the application of pressure causes bump material 174 to undergo a plastic deformation and cover the top surface and side surfaces of conductive trace 176 and asperities 180. The plastic flow of bump material 174 creates macroscopic mechanical interlocking points between the bump material and the top surface and side surfaces of conductive trace 176 and asperities 180. The plastic flow of bump material 174 occurs around the top surface and side surfaces of conductive 176 and asperities 180, but does not extend excessively onto substrate 178, which could cause electrical shorting and other defects. The mechanical interlock between the bump material and the top surface and side surfaces of conductive trace 176 and asperities 180 provides a robust connection with greater contact area between the respective surfaces, without significantly increasing the bonding force. The mechanical interlock between the bump material and the top surface and side surfaces of conductive trace 176 and asperities 180 also reduces lateral die shifting during subsequent manufacturing processes, such as encapsulation.

Figure 6C:
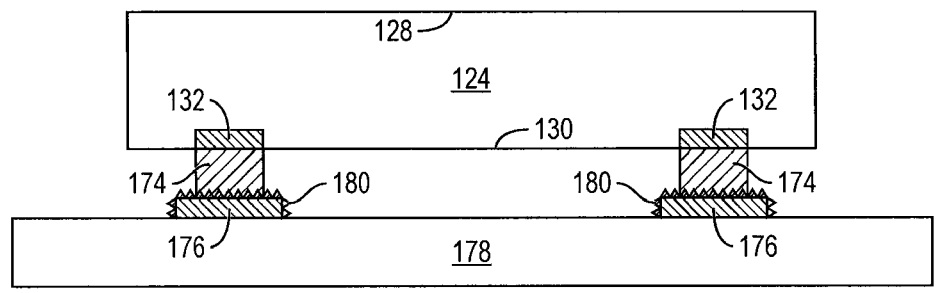

FIG. 6c shows another BOL embodiment with bump material 174 narrower than conductive trace 176. A pressure or force F is applied to back surface 128 of semiconductor die 124 to press bump material 174 onto conductive trace 176 and asperities 180. The force F can be applied with an elevated temperature. Due to the compliant nature of bump material 174, the bump material deforms or extrudes over the top surface of conductive trace 176 and asperities 180. In particular, the application of pressure causes bump material 174 to undergo a plastic deformation and cover the top surface of conductive trace 176 and asperities 180. The plastic flow of bump material 174 creates macroscopic mechanical interlocking points between the bump material and the top surface of conductive trace 176 and asperities 180. The mechanical interlock between the bump material and the top surface of conductive trace 176 and asperities 180 provides a robust connection with greater contact area between the respective surfaces, without significantly increasing the bonding force. The mechanical interlock between the bump material and the top surface of conductive trace 176 and asperities 180 also reduces lateral die shifting during subsequent manufacturing processes, such as encapsulation.

Figure 6D:
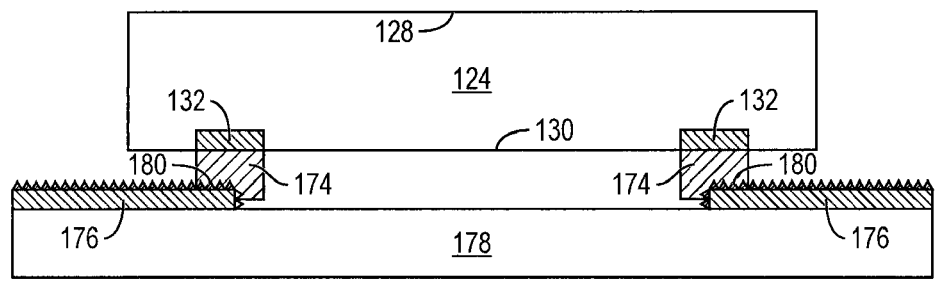

FIG. 6d shows another BOL embodiment with bump material 174 formed over an edge of conductive trace 176, i.e., part of the bump material is over the conductive trace and part of the bump material is not over the conductive trace. A pressure or force F is applied to back surface 128 of semiconductor die 124 to press bump material 174 onto conductive trace 176 and asperities 180. The force F can be applied with an elevated temperature. Due to the compliant nature of bump material 174, the bump material deforms or extrudes over the top surface and side surfaces of conductive trace 176 and asperities 180. In particular, the application of pressure causes bump material 174 to undergo a plastic deformation and cover the top surface and side surfaces of conductive trace 176 and asperities 180. The plastic flow of bump material 174 creates macroscopic mechanical interlocking between the bump material and the top surface and side surfaces of conductive trace 176 and asperities 180. The mechanical interlock between the bump material and the top surface and side surfaces of conductive trace 176 and asperities 180 provides a robust connection with greater contact area between the respective surfaces, without significantly increasing the bonding force. The mechanical interlock between the bump material and the top surface and side surfaces of conductive trace 176 and asperities 180 also reduces lateral die shifting during subsequent manufacturing processes, such as encapsulation.

Figure 7A:
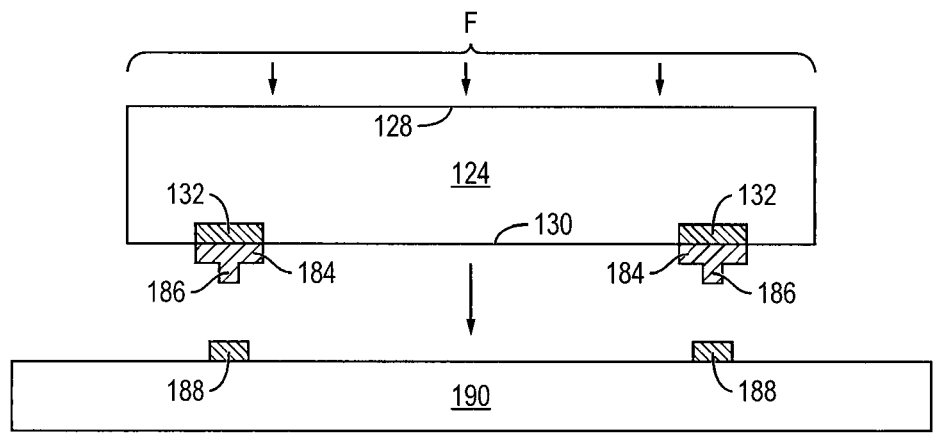
FIGS. 7a-7c illustrate stepped bump and stud bump interconnect structures bonded to the conductive traces.
Figure 7B:
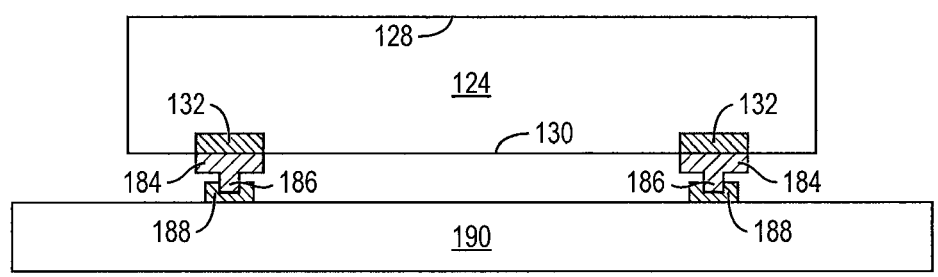
Figure 7C:
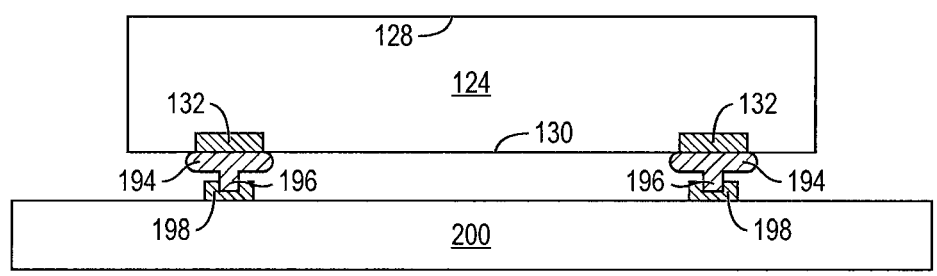

FIGS. 7a-7c show a BOL embodiment of semiconductor die 124 with bump material 184 formed over contact pads 132, similar to FIG. 3c. A tip 186 extends from the body of bump material 184 as a stepped bump with tip 186 narrower than the body of bump material 184, as shown in FIG. 7a. Semiconductor die 124 is positioned so that bump material 184 is aligned with an interconnect site on conductive trace 188 on substrate 190. More specifically, tip 186 is centered over an interconnect site on conductive trace 188. Alternatively, bump material 184 and tip 186 can be aligned with a conductive pad or other interconnect site formed on substrate 190. Bump material 184 is wider than conductive trace 188 on substrate 190.

Conductive trace 188 is generally compliant and undergoes plastic deformation greater than about 25 µm under a force equivalent to a vertical load of about 250 grams. A pressure or force F is applied to back surface 128 of semiconductor die 124 to press tip 184 onto conductive trace 188. The force F can be applied with an elevated temperature. Due to the compliant nature of conductive trace 188, the conductive trace deforms around tip 186, as shown in FIG. 7b. In particular, the application of pressure causes conductive trace 188 to undergo a plastic deformation and cover the top surface and side surfaces of tip 186.

FIG. 7c shows another BOL embodiment with rounded bump material 194 formed over contact pads 132. A tip 196 extends from the body of bump material 194 to form a stud bump with the tip narrower than the body of bump material 194. Semiconductor die 124 is positioned so that bump material 194 is aligned with an interconnect site on conductive trace 198 on substrate 200. More specifically, tip 196 is centered over an interconnect site on conductive trace 198. Alternatively, bump material 194 and tip 196 can be aligned with a conductive pad or other interconnect site formed on substrate 200. Bump material 194 is wider than conductive trace 198 on substrate 200.

Conductive trace 198 is generally compliant and undergoes plastic deformation greater than about 25 µm under a force equivalent to a vertical load of about 250 grams. A pressure or force F is applied to back surface 128 of semiconductor die 124 to press tip 196 onto conductive trace 198. The force F can be applied with an elevated temperature. Due to the compliant nature of conductive trace 198, the conductive trace deforms around tip 196. In particular, the application of pressure causes conductive trace 198 to undergo a plastic deformation and cover the top surface and side surfaces of tip 196.

The conductive traces described in FIGS. 4a-4g, 5a-5d, and 6a-6d can also be compliant material as described in FIGS. 7a-7c.

Figure 8A:
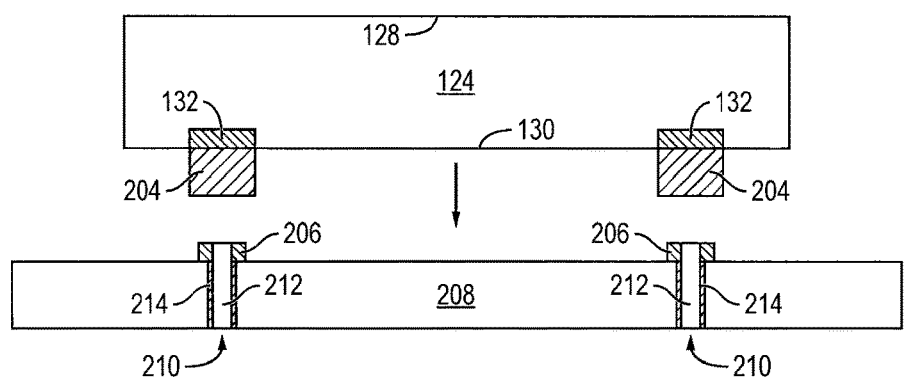
FIGS. 8a-8b illustrate conductive traces with conductive vias.
Figure 8B:
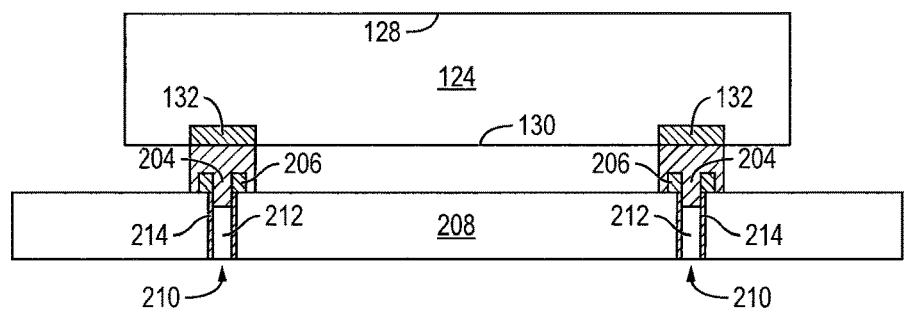

FIGS. 8a-8b show a BOL embodiment of semiconductor die 124 with bump material 204 formed over contact pads 132, similar to FIG. 3c. Bump material 204 is generally compliant and undergoes plastic deformation greater than about 25 µm under a force equivalent to a vertical load of about 250 grams. Bump material 204 is wider than conductive trace 206 on substrate 208. A conductive via 210 is formed through conductive trace 206 with an opening 212 and conductive sidewalls 214, as shown in FIG. 8a.

Semiconductor die 124 is positioned so that bump material 204 is aligned with an interconnect site on conductive trace 206, see FIGS. 12a-12g. Alternatively, bump material 204 can be aligned with a conductive pad or other interconnect site formed on substrate 208. A pressure or force F is applied to back surface 128 of semiconductor die 124 to press bump material 204 onto conductive trace 206 and into opening 212 of conductive via 210. The force F can be applied with an elevated temperature. Due to the compliant nature of bump material 204, the bump material deforms or extrudes around the top surface and side surfaces of conductive trace 176 and into opening 212 of conductive vias 210, as shown in FIG. 8b. In particular, the application of pressure causes bump material 204 to undergo a plastic deformation and cover the top surface and side surfaces of conductive trace 206 and into opening 212 of conductive via 210. Bump material 204 is thus electrically connected to conductive trace 206 and conductive sidewalls 214 for z-direction vertical interconnect through substrate 208. The plastic flow of bump material 204 creates a mechanical interlock between the bump material and the top surface and side surfaces of conductive trace 206 and opening 212 of conductive via 210. The mechanical interlock between the bump material and the top surface and side surfaces of conductive trace 206 and opening 212 of conductive via 210 provides a robust connection with greater contact area between the respective surfaces, without significantly increasing the bonding force. The mechanical interlock between the bump material and the top surface and side surfaces of conductive trace 206 and opening 212 of conductive via 210 also reduces lateral die shifting during subsequent manufacturing processes, such as encapsulation. Since conductive via 210 is formed within the interconnect site with bump material 204, the total substrate interconnect area is reduced.

In the BOL embodiments of FIGS. 4a-4g, 5a-5d, 6a-6d, 7a-7c, and 8a-8b, by making the conductive trace narrower than the interconnect structure, the conductive trace pitch can be reduced to increase routing density and I/O count. The narrower conductive trace reduces the force F needed to deform the interconnect structure around the conductive trace. For example, the requisite force F may be 30-50% of the force needed to deform a bump against a conductive trace or pad that is wider than the bump. The lower compressive force F is useful for fine pitch interconnect and small die to maintain coplanarity within a specified tolerance and achieve uniform z-direction deformation and high reliability interconnect union. In addition, deforming the interconnect structure around the conductive trace mechanically locks the bump to the trace to prevent die shifting or die floating during reflow.

Figure 9C:
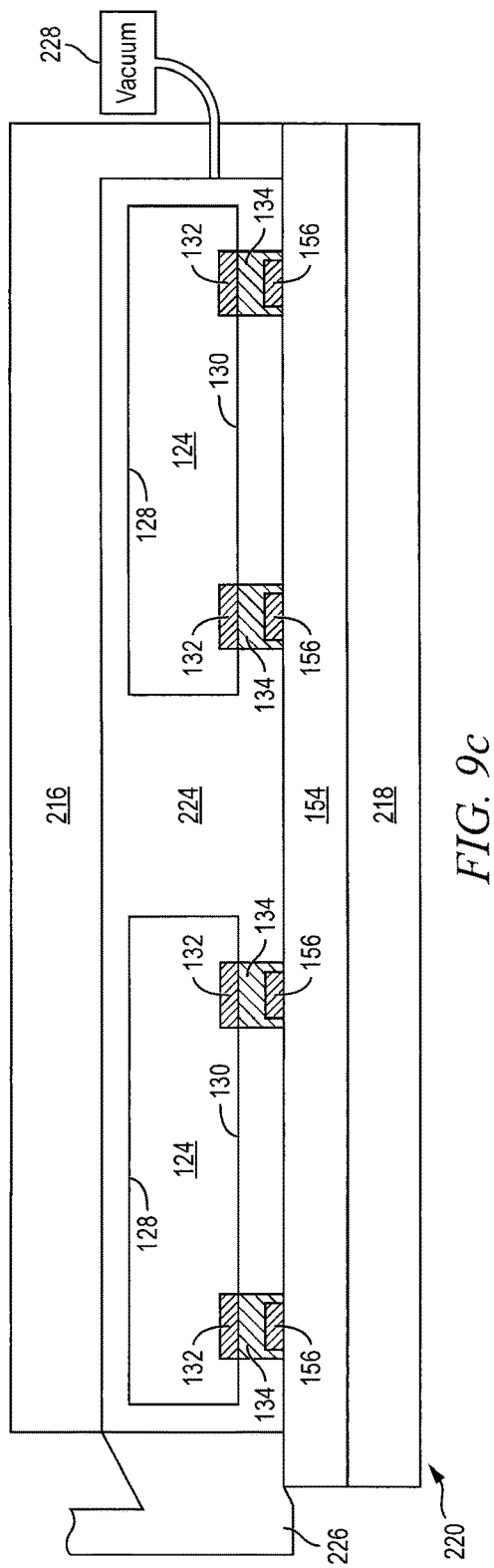

FIGS. 9a-9c show a mold underfill (MUF) process to deposit encapsulant around the bumps between the semiconductor die and substrate. FIG. 9a shows semiconductor die 124 mounted to substrate 154 using bump material 134 from FIG. 4b and placed between upper mold support 216 and lower mold support 218 of chase mold 220. The other semiconductor die and substrate combinations from FIGS. 4a-4g, 5a-5d, 6a-6d, 7a-7c, and 8a-8b can be placed between upper mold support 216 and lower mold support 218 of chase mold 220. The upper mold support 216 includes compressible releasing film 222.

In FIG. 9b, upper mold support 216 and lower mold support 218 are brought together to enclose semiconductor die 124 and substrate 154 with an open space over the substrate and between the semiconductor die and substrate. Compressible releasing film 222 conforms to back surface 128 and side surfaces of semiconductor die 124 to block formation of encapsulant on these surfaces. An encapsulant 224 in a liquid state is injected into one side of chase mold 220 with nozzle 226 while an optional vacuum assist 228 draws pressure from the opposite side to uniformly fill the open space over substrate 154 and the open space between semiconductor die 124 and substrate 154 with the encapsulant. Encapsulant 224 can be polymer composite material, such as epoxy resin with filler, epoxy acrylate with filler, or polymer with proper filler. Encapsulant 224 is non-conductive and environmentally protects the semiconductor device from external elements and contaminants. Compressible material 222 prevents encapsulant 224 from flowing over back surface 128 and around the side surfaces of semiconductor die 124. Encapsulant 224 is cured. The back surface 128 and side surfaces of semiconductor die 124 remain exposed from encapsulant 224.

FIG. 9c shows an embodiment of MUF and mold overfill (MOF) without compressible material 222. Semiconductor die 124 and substrate 154 are placed between upper mold support 216 and lower mold support 218 of chase mold 220. The upper mold support 216 and lower mold support 218 are brought together to enclose semiconductor die 124 and substrate 154 with an open space over the substrate, around the semiconductor die, and between the semiconductor die and substrate. Encapsulant 224 in a liquid state is injected into one side of chase mold 220 with nozzle 226 while an optional vacuum assist 228 draws pressure from the opposite side to uniformly fill the open space around semiconductor die 124 and over substrate 154 and the open space between semiconductor die 124 and substrate 154 with the encapsulant. Encapsulant 224 is cured.

In another embodiment, the nozzle can also be placed in a central region of the chase mold or strip of die to distribute the encapsulant outward to the edges of the semiconductor die and substrate.

Figure 10:
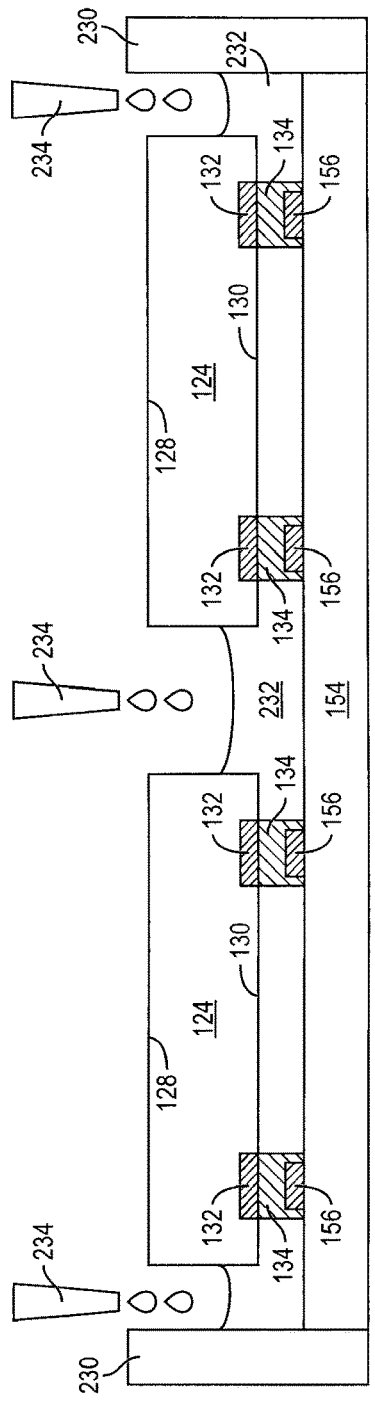
FIG. 10 illustrates another mold underfill between the semiconductor die and substrate.

FIG. 10 shows another embodiment of depositing encapsulant around semiconductor die 124 and in the gap between semiconductor die 124 and substrate 154. Semiconductor die 124 and substrate 154 are enclosed by dam 230. Encapsulant 232 is dispensed from nozzles 234 in a liquid state into dam 230 to fill the open space over substrate 154 and the open space between semiconductor die 124 and substrate 154. The volume of encapsulant 232 dispensed from nozzles 234 is controlled to fill dam 230 without covering back surface 128 or the side surfaces of semiconductor die 124. Encapsulant 232 is cured.

Figure 11:
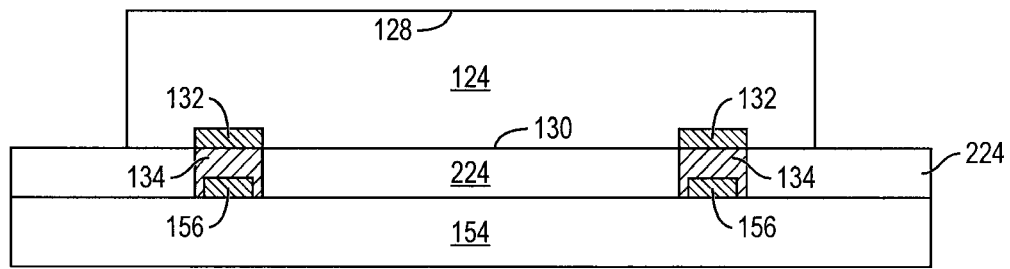
FIG. 11 illustrates the semiconductor die and substrate after mold underfill.

FIG. 11 shows semiconductor die 124 and substrate 154 after the MUF process from FIGS. 9a, 9c, and 10. Encapsulant 224 is uniformly distributed over substrate 154 and around bump material 134 between semiconductor die 124 and substrate 154.

Figure 12A:
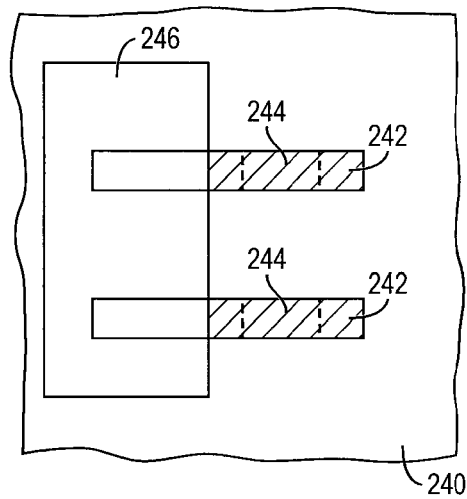
FIGS. 12a-12g illustrate various arrangements of the conductive traces with open solder registration.

FIGS. 12a-12g show top views of various conductive trace layouts on substrate or PCB 240. In FIG. 12a, conductive trace 242 is a straight conductor with integrated bump pad or interconnect site 244 formed on substrate 240. The sides of substrate bump pad 244 can be co-linear with conductive trace 242. In the prior art, a solder registration opening (SRO) is typically formed over the interconnect site to contain the bump material during reflow. The SRO increases interconnect pitch and reduces I/O count. In contrast, masking layer 246 can be formed over a portion of substrate 240; however, the masking layer is not formed around substrate bump pad 244 of conductive trace 242. That is, the portion of conductive trace 242 designed to mate with the bump material is devoid of any SRO of masking layer 246 that would have been used for bump containment during reflow.

Semiconductor die 124 is placed over substrate 240 and bump material 134 is aligned with substrate bump pads 244. Bump material 134 is electrically and metallurgically connected to substrate bump pads 244 by bringing the bump material in physical contact with the bump pad and then reflowing the bump material under a reflow temperature.

Figure 12B:
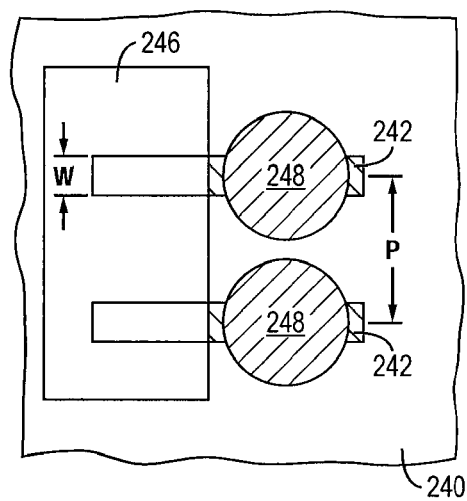

In another embodiment, an electrically conductive bump material is deposited over substrate bump pad 244 using an evaporation, electrolytic plating, electroless plating, ball drop, or screen printing process. The bump material can be Al, Sn, Ni, Au, Ag, Pb, Bi, Cu, solder, and combinations thereof, with an optional flux solution. For example, the bump material can be eutectic Sn/Pb, high-lead solder, or lead-free solder. The bump material is bonded to substrate bump pad 244 using a suitable attachment or bonding process. In one embodiment, the bump material is reflowed by heating the material above its melting point to form bump or interconnect 248, as shown in FIG. 12b. In some applications, bump 248 is reflowed a second time to improve electrical contact to substrate bump pad 244. The bump material around the narrow substrate bump pad 244 maintains die placement during reflow.

In high routing density applications, it is desirable to minimize escape pitch of conductive traces 242. The escape pitch between conductive traces 242 can be reduced by eliminating the masking layer for the purpose of reflow containment, i.e., by reflowing the bump material without a masking layer. Since no SRO is formed around die bump pads 132 or substrate bump pad 244, conductive traces 242 can be formed with a finer pitch, i.e., conductive trace 242 can be disposed closer together or to nearby structures. With no SRO around substrate bump pad 244, the pitch between conductive traces 242 is given as P=D+PLT+W/2, wherein D is the base diameter of bump 248, PLT is die placement tolerance, and W is the width of conductive trace 242. In one embodiment, given a bump base diameter of 100 μm, PLT of 10 μm, and trace line width of 30 μm, the minimum escape pitch of conductive trace 242 is 125 μm. The maskless bump formation eliminates the need to account for the ligament spacing of masking material between adjacent openings, solder mask registration (SRT), and minimum resolvable SRO, as found in the prior art.

When the bump material is reflowed without a masking layer to metallurgically and electrically connect die bump pad 132 to substrate bump pad 244, the wetting and surface tension causes the bump material to maintain self-confinement and be retained within the space between die bump pad 132 and substrate bump pad 244 and portion of substrate 240 immediately adjacent to conductive trace 242 substantially within the footprint of the bump pads.

To achieve the desired self-confinement property, the bump material can be immersed in a flux solution prior to placement on die bump pad 132 or substrate bump pad 244 to selectively render the region contacted by the bump material more wettable than the surrounding area of conductive traces 242. The molten bump material remains confined substantially within the area defined by the bump pads due to the wettable properties of the flux solution. The bump material does not run-out to the less wettable areas. A thin oxide layer or other insulating layer can be formed over areas where bump material is not intended to make the area less wettable. Hence, masking layer 240 is not needed around die bump pad 132 or substrate bump pad 244.

Figure 12C:
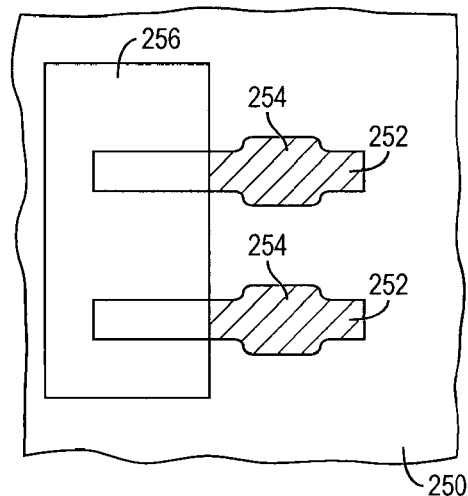

FIG. 12c shows another embodiment of parallel conductive traces 252 as a straight conductor with integrated rectangular bump pad or interconnect site 254 formed on substrate 250. In this case, substrate bump pad 254 is wider than conductive trace 242, but less than the width of the mating bump. The sides of substrate bump pad 254 can be parallel to conductive trace 252. Masking layer 256 can be formed over a portion of substrate 250; however, the masking layer is not formed around substrate bump pad 254 of conductive trace 252. That is, the portion of conductive trace 252 designed to mate with the bump material is devoid of any SRO of masking layer 256 that would have been used for bump containment during reflow.

Figure 12D:
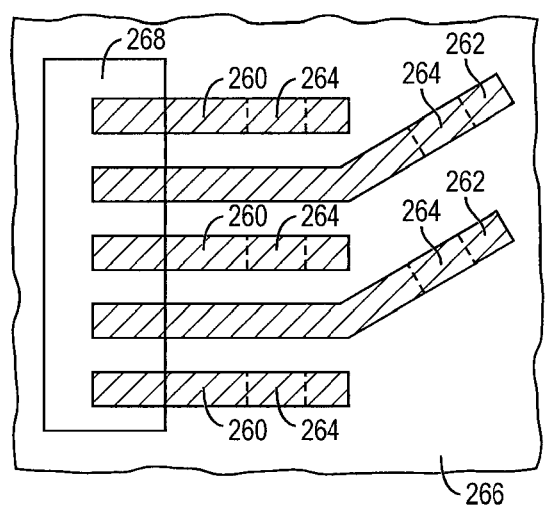

FIG. 12d shows another embodiment of conductive traces 260 and 262 arranged in an array of multiple rows with offset integrated bump pad or interconnect site 264 formed on substrate 266 for maximum interconnect density and capacity. Alternate conductive traces 260 and 262 include an elbow for routing to bump pads 264. The sides of each substrate bump pad 264 is co-linear with conductive traces 260 and 262. Masking layer 268 can be formed over a portion of substrate 266; however, masking layer 268 is not formed around substrate bump pad 264 of conductive traces 260 and 262. That is, the portion of conductive trace 260 and 262 designed to mate with the bump material is devoid of any SRO of masking layer 268 that would have been used for bump containment during reflow.

Figure 12E:
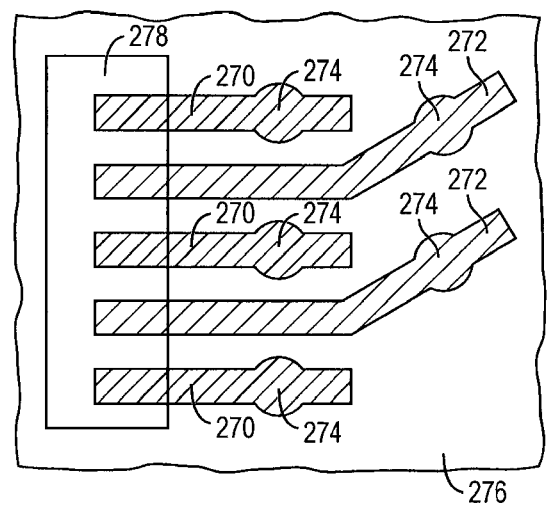

FIG. 12e shows another embodiment of conductive traces 270 and 272 arranged in an array of multiple rows with offset integrated bump pad or interconnect site 274 formed on substrate 276 for maximum interconnect density and capacity. Alternate conductive traces 270 and 272 include an elbow for routing to bump pads 274. In this case, substrate bump pad 274 is rounded and wider than conductive traces 270 and 272, but less than the width of the mating interconnect bump material. Masking layer 278 can be formed over a portion of substrate 276; however, masking layer 278 is not formed around substrate bump pad 274 of conductive traces 270 and 272. That is, the portion of conductive trace 270 and 272 designed to mate with the bump material is devoid of any SRO of masking layer 278 that would have been used for bump containment during reflow.

Figure 12F:
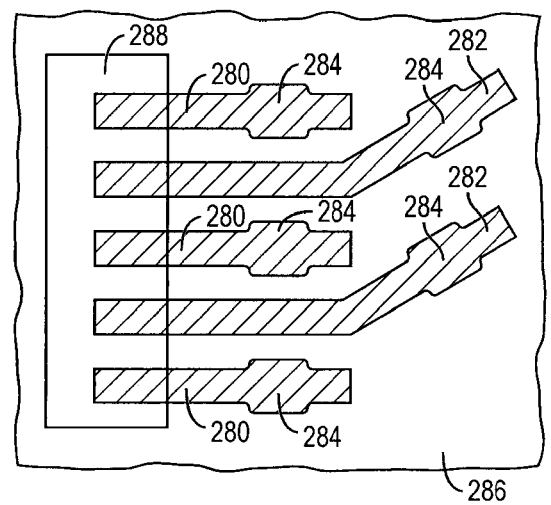

FIG. 12f shows another embodiment of conductive traces 280 and 282 arranged in an array of multiple rows with offset integrated bump pad or interconnect site 284 formed on substrate 286 for maximum interconnect density and capacity. Alternate conductive traces 280 and 282 include an elbow for routing to bump pads 284. In this case, substrate bump pad 254 is rectangular and wider than conductive traces 280 and 282, but less than the width of the mating interconnect bump material. Masking layer 288 can be formed over a portion of substrate 286; however, masking layer 288 is not formed around substrate bump pad 284 of conductive traces 280 and 282. That is, the portion of conductive trace 280 and 282 designed to mate with the bump material is devoid of any SRO of masking layer 288 that would have been used for bump containment during reflow.

As one example of the interconnect process, semiconductor die 124 is placed over substrate 266 and bump material 134 is aligned with substrate bump pads 264 from FIG. 12d. Bump material 134 is electrically and metallurgically connected to substrate bump pad 264 by pressing the bump material or by bringing the bump material in physical contact with the bump pad and then reflowing the bump material under a reflow temperature, as described for FIGS. 4a-4g, 5a-5d, 6a-6d, 7a-7c, and 8a-8b.

Figure 12G:
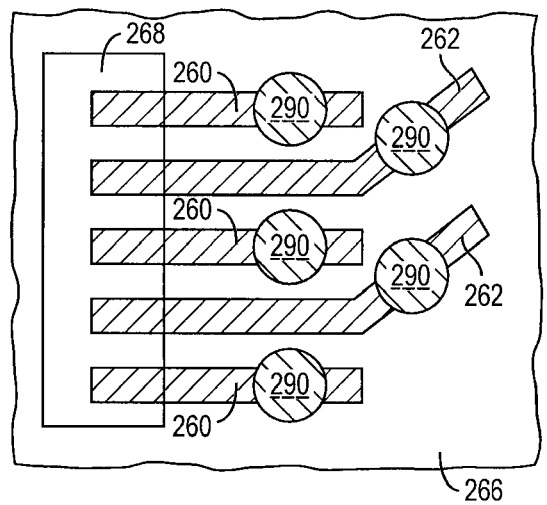

In another embodiment, an electrically conductive bump material is deposited over substrate bump pad 264 using an evaporation, electrolytic plating, electroless plating, ball drop, or screen printing process. The bump material can be Al, Sn, Ni, Au, Ag, Pb, Bi, Cu, solder, and combinations thereof, with an optional flux solution. For example, the bump material can be eutectic Sn/Pb, high-lead solder, or lead-free solder. The bump material is bonded to substrate bump pad 264 using a suitable attachment or bonding process. In one embodiment, the bump material is reflowed by heating the material above its melting point to form bump or interconnect 290, as shown in FIG. 12g. In some applications, bump 290 is reflowed a second time to improve electrical contact to substrate bump pad 264. The bump material around the narrow substrate bump pad 264 maintains die placement during reflow. Bump material 134 or bumps 290 can also be formed on substrate bump pad configurations of FIGS. 12a-12g.

In high routing density applications, it is desirable to minimize escape pitch of conductive traces 260 and 262 or other conductive trace configurations of FIGS. 12a-12g. The escape pitch between conductive traces 260 and 262 can be reduced by eliminating the masking layer for the purpose of reflow containment, i.e., by reflowing the bump material without a masking layer. Since no SRO is formed around die bump pad 132 or substrate bump pad 264, conductive traces 260 and 262 can be formed with a finer pitch, i.e., conductive traces 260 and 262 can be disposed closer together or to nearby structures. With no SRO around substrate bump pad 264, the pitch between conductive traces 260 and 262 is given as P=D+PLT+W/2, wherein D is the base diameter of bump 290, PLT is die placement tolerance, and W is the width of conductive traces 260 and 262. In one embodiment, given a bump base diameter of 100 μm, PLT of 10 μm, and trace line width of 30 μm, the minimum escape pitch of conductive traces 260 and 262 is 125 µm. The mask-less bump formation eliminates the need to account for the ligament spacing of masking material between adjacent openings, SRT, and minimum resolvable SRO, as found in the prior art.

When the bump material is reflowed without a masking layer to metallurgically and electrically connect die bump pad 132 to substrate bump pad 264, the wetting and surface tension causes the bump material to maintain self-confinement and be retained within the space between die bump pad 132 and substrate bump pad 264 and portion of substrate 266 immediately adjacent to conductive traces 260 and 262 substantially within the footprint of the bump pads.

To achieve the desired self-confinement property, the bump material can be immersed in a flux solution prior to placement on die bump pad 132 or substrate bump pad 264 to selectively render the region contacted by the bump material more wettable than the surrounding area of conductive traces 260 and 262. The molten bump material remains confined substantially within the area defined by the bump pads due to the wettable properties of the flux solution. The bump material does not run-out to the less wettable areas. A thin oxide layer or other insulating layer can be formed over areas where bump material is not intended to make the area less wettable. Hence, masking layer 268 is not needed around die bump pad 132 or substrate bump pad 264.

Figure 13A:
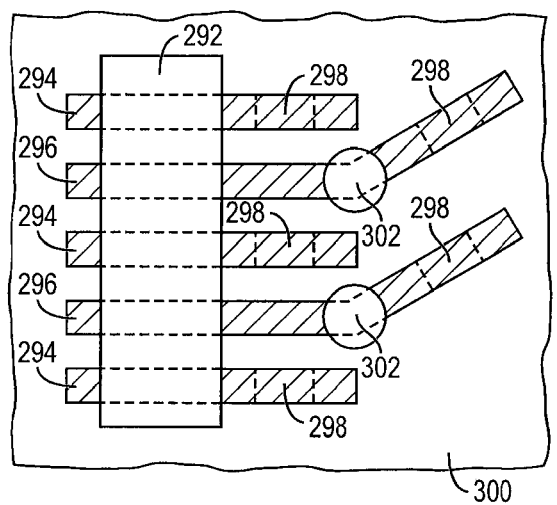
FIGS. 13a-13b illustrate the open solder registration with patches between the conductive traces.
Figure 13B:
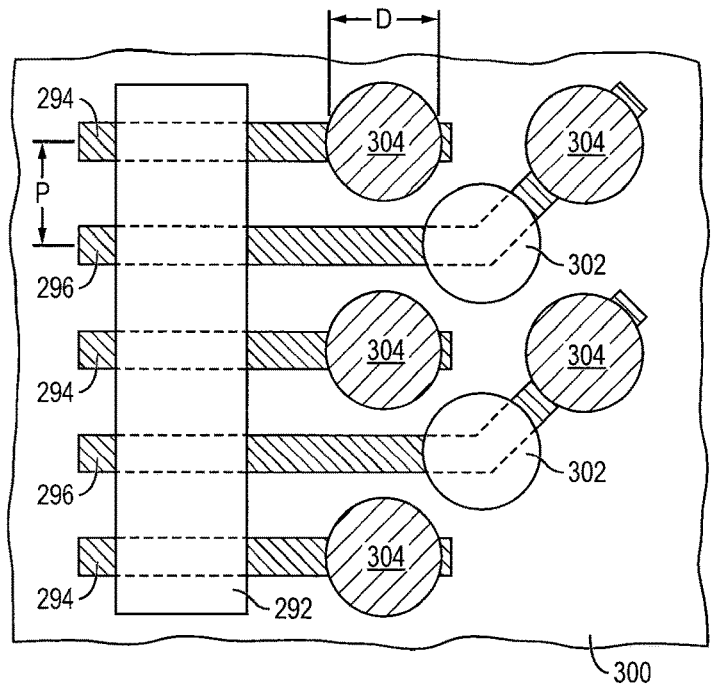

In FIG. 13a, masking layer 292 is deposited over a portion of conductive traces 294 and 296. However, masking layer 292 is not formed over integrated bump pads 298. Consequently, there is no SRO for each bump pad 298 on substrate 300. A non-wettable masking patch 302 is formed on substrate 300 interstitially within the array of integrated bump pads 298, i.e., between adjacent bump pads. The masking patch 302 can also be formed on semiconductor die 124 interstitially within the array of die bump pads 132. More generally, the masking patch is formed in close proximity to the integrated bump pads in any arrangement to prevent run-out to less wettable areas.

Semiconductor die 124 is placed over substrate 300 and bump material 134 is aligned with substrate bump pads 298. Bump material 134 is electrically and metallurgically connected to substrate bump pad 298 by pressing the bump material or by bringing the bump material in physical contact with the bump pad and then reflowing the bump material under a reflow temperature, as described for FIGS. 4a-4g, 5a-5d, 6a-6d, 7a-7c, and 8a-8b.

In another embodiment, an electrically conductive bump material is deposited over die integrated bump pads 298 using an evaporation, electrolytic plating, electroless plating, ball drop, or screen printing process. The bump material can be Al, Sn, Ni, Au, Ag, Pb, Bi, Cu, solder, and combinations thereof, with an optional flux solution. For example, the bump material can be eutectic Sn/Pb, high-lead solder, or lead-free solder. The bump material is bonded to integrated bump pads 298 using a suitable attachment or bonding process. In one embodiment, the bump material is reflowed by heating the material above its melting point to form spherical balls or bumps 304. In some applications, bumps 304 are reflowed a second time to improve electrical contact to integrated bump pads 298. The bumps can also be compression bonded to integrated bump pads 298. Bumps 304 represent one type of interconnect structure that can be formed over integrated bump pads 298. The interconnect structure can also use stud bump, micro bump, or other electrical interconnect.

In high routing density applications, it is desirable to minimize escape pitch. In order to reduce the pitch between conductive traces 294 and 296, the bump material is reflowed without a masking layer around integrated bump pads 298. The escape pitch between conductive traces 294 and 296 can be reduced by eliminating the masking layer and associated SROs around the integrated bump pads for the purpose of reflow containment, i.e., by reflowing the bump material without a masking layer. Masking layer 292 can be formed over a portion of conductive traces 294 and 296 and substrate 300 away from integrated bump pads 298; however, masking layer 292 is not formed around integrated bump pads 298. That is, the portion of conductive trace 294 and 296 designed to mate with the bump material is devoid of any SRO of masking layer 292 that would have been used for bump containment during reflow.

In addition, masking patch 302 is formed on substrate 300 interstitially within the array of integrated bump pads 298. Masking patch 302 is non-wettable material. Masking patch 302 can be the same material as masking layer 292 and applied during the same processing step, or a different material during a different processing step. Masking patch 302 can be formed by selective oxidation, plating, or other treatment of the portion of the trace or pad within the array of integrated bump pads 298. Masking patch 302 confines bump material flow to integrated bump pads 298 and prevents leaching of conductive bump material to adjacent structures.

When the bump material is reflowed with masking patch 302 interstitially disposed within the array of integrated bump pads 298, the wetting and surface tension causes the bump material to be confined and retained within the space between die bump pads 132 and integrated bump pads 298 and portion of substrate 300 immediately adjacent to conductive traces 294 and 296 and substantially within the footprint of the integrated bump pads 298.

To achieve the desired confinement property, the bump material can be immersed in a flux solution prior to placement on die bump pad 132 or integrated bump pad 298 to selectively render the region contacted by the bump material more wettable than the surrounding area of conductive traces 294 and 296. The molten bump material remains confined substantially within the area defined by the bump pads due to the wettable properties of the flux solution. The bump material does not run-out to the less wettable areas. A thin oxide layer or other insulating layer can be formed over areas where bump material is not intended to make the area less wettable. Hence, masking layer 292 is not needed around die bump pads 132 or integrated bump pads 298.

Since no SRO is formed around die bump pads 132 or integrated bump pads 298, conductive traces 294 and 296 can be formed with a finer pitch, i.e., the conductive traces can be disposed closer to adjacent structures without making contact and forming electrical shorts. Assuming the same solder registration design rule, the pitch between conductive traces 294 and 296 is given as $P=(1.1D+W)/2$, where D is the base diameter of bump 304 and W is the width of conductive traces 294 and 296. In one embodiment, given a bump diameter of 100 µm and trace line width of 20 µm, the minimum escape pitch of conductive traces 294 and 296 is 65 µm. The bump formation eliminates the need to account for the ligament spacing of masking material between adjacent openings and minimum resolvable SRO, as found in the prior art.

Figure 14:
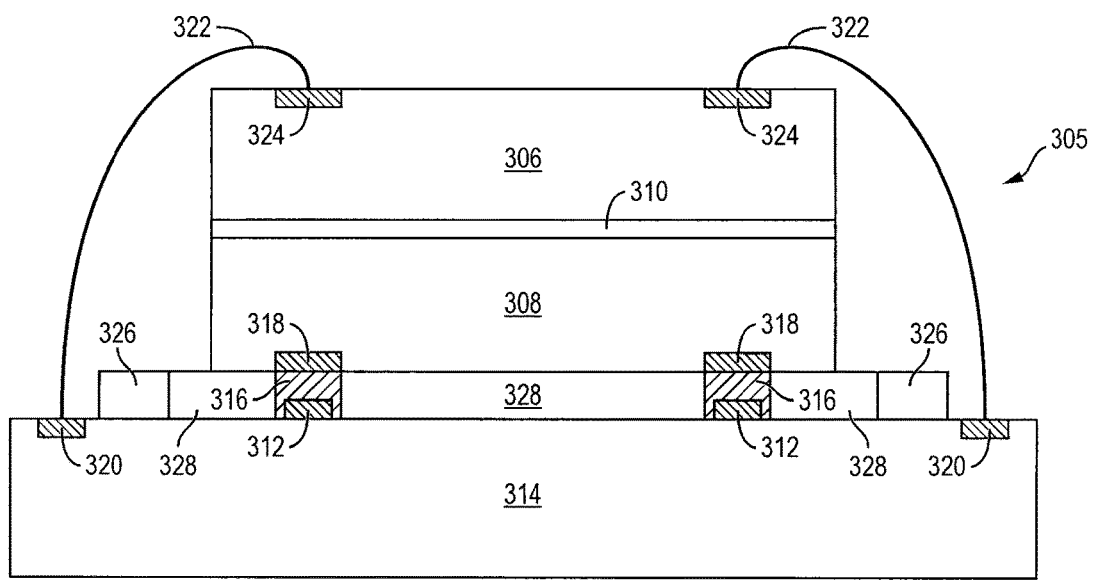
FIG. 14 illustrates a POP with masking layer dam to restrain the encapsulant during mold underfill.

FIG. 14 shows package-on-package (PoP) 305 with semiconductor die 306 stacked over semiconductor die 308 using die attach adhesive 310. Semiconductor die 306 and 308 each have an active surface containing analog or digital circuits implemented as active devices, passive devices, conductive layers, and dielectric layers formed within the die and electrically interconnected according to the electrical design and function of the die. For example, the circuit may include one or more transistors, diodes, and other circuit elements formed within the active surface to implement analog circuits or digital circuits, such as DSP, ASIC, memory, or other signal processing circuit. Semiconductor die 306 and 308 may also contain IPDs, such as inductors, capacitors, and resistors, for RF signal processing.

Semiconductor die 306 is mounted to conductive traces 312 formed on substrate 314 using bump material 316 formed on contact pads 318, using any of the embodiments from FIGS. 4a-4g, 5a-5d, 6a-6d, 7a-7c, or 8a-8b. Semiconductor die 308 is electrically connected to contact pads 320 formed on substrate 314 using bond wires 322. The opposite end of bond wire 322 is bonded to contact pads 324 on semiconductor die 306.

Masking layer 326 is formed over substrate 314 and opened beyond the footprint of semiconductor die 306. While masking layer 326 does not confine bump material 316 to conductive traces 312 during reflow, the open mask can operate as a dam to prevent encapsulant 328 from migrating to contact pads 320 or bond wires 322 during MUF. Encapsulant 328 is deposited between semiconductor die 308 and substrate 314, similar to FIGS. 9a-9c. Masking layer 326 blocks MUF encapsulant 328 from reaching contact pads 320 and bond wires 322, which could cause a defect. Masking layer 326 allows a larger semiconductor die to be placed on a given substrate without risk of encapsulant 328 bleeding onto contact pads 320.

While one or more embodiments of the present invention have been illustrated in detail, the skilled artisan will appreciate that modifications and adaptations to those embodiments may be made without departing from the scope of the present invention as set forth in the following claims.

The invention claimed is:

1. A method of making a semiconductor device, comprising:
providing a semiconductor die including a plurality of interconnect structures formed over a surface of the semiconductor die;
providing a substrate;
forming a plurality of conductive traces with interconnect sites disposed at intermediate locations along a length of the conductive traces over the substrate with the conductive traces extending in opposite directions from the interconnect sites;
forming a plurality of individual non-conductive masking patches over an area of the substrate interstitial between and physically separated from the interconnect sites, wherein the interconnect structures including a width substantially the same as a width of the conductive traces away from the interconnect sites and wider than the interconnect sites;
bonding the interconnect structures to the interconnect sites absent a mask opening so that the interconnect structures cover a top surface and side surfaces of the interconnect sites; and
depositing an encapsulant around the interconnect structures between the semiconductor die and substrate.

2. The method of claim 1, further including bonding the interconnect structures to the interconnect sites under pressure or reflow temperature.

3. The method of claim 1, further including forming a masking layer over an area of the substrate away from the interconnect sites.

4. The method of claim 1, wherein the interconnect structures include bumps or bump material.

5. The method of claim 1, wherein the interconnect structures include a fusible portion and non-fusible portion.

6. The method of claim 1, wherein the interconnect structures include a conductive pillar and bump formed over the conductive pillar.

7. The method of claim 1, further including forming asperities over the interconnect sites or interconnect structures.

8. A method of making a semiconductor device, comprising:
providing a semiconductor die including an interconnect structure formed over a surface of the semiconductor die;
providing a substrate;
forming a conductive trace with an interconnect site disposed at an intermediate location along the conductive trace over the substrate with the conductive trace extending in opposite directions from the interconnect site, the interconnect site being narrower than the interconnect structure;
forming a plurality of individual non-conductive masking patches over an area of the substrate interstitial around and physically separated from the interconnect site; and
bonding the interconnect structure to the interconnect site absent a mask opening so that the interconnect structure covers a top surface and side surfaces of the interconnect site.

9. The method of claim 8, further including bonding the interconnect structure to the interconnect site under pressure or reflow temperature.

10. The method of claim 8, further including depositing an encapsulant around the interconnect structure between the semiconductor die and substrate.

11. The method of claim 10, further including forming a masking layer over an area of the substrate away from the interconnect site.

12. The method of claim 11, wherein the masking layer forms a dam to block the encapsulant from extending beyond a footprint of the semiconductor die.

13. The method of claim 8, wherein the interconnect structure includes a fusible portion and non-fusible portion.

14. The method of claim 8, further including forming asperities over the interconnect site or interconnect structure.

15. A semiconductor device, comprising:
a semiconductor die including a plurality of interconnect structures formed over a surface of the semiconductor die;
a substrate;
a plurality of conductive traces with interconnect sites disposed at intermediate locations along a length of the conductive traces formed over the substrate with the conductive traces extending in opposite directions from the interconnect sites, the interconnect sites including a width substantially the same as a width of the conductive traces away from the interconnect sites and narrower than the interconnect structures to increase interconnect density;
a plurality of individual non-conductive masking patches formed over an area of the substrate interstitial between and physically separated from the interconnect sites, wherein the interconnect structures are bonded to the interconnect sites so that the interconnect structures cover a top surface and side surfaces of the interconnect sites; and an encapsulant deposited around the interconnect structures between the semiconductor die and substrate.

16. The semiconductor device of claim 15, wherein the interconnect structures are bonded to the interconnect sites under pressure or reflow temperature.

17. The semiconductor device of claim 15, wherein the interconnect structures include a fusible portion and non-fusible portion.

18. The semiconductor device of claim 15, wherein the interconnect structures include a conductive pillar and bump formed over the conductive pillar.

19. The semiconductor device of claim 15, further including asperities formed over the interconnect sites or interconnect structures.

20. A semiconductor device, comprising:
a substrate;
a conductive trace with an interconnect site disposed at an intermediate location along the conductive trace formed over the substrate with the conductive trace extending in opposite directions from the interconnect site;
a plurality of individual non-conductive masking patches formed over an area of the substrate interstitial around and physically separated from the interconnect site;
a semiconductor die including an interconnect structure formed over a surface of the semiconductor die with the interconnect structure bonded to the interconnect site absent a mask opening so that the interconnect structure covers a top surface and side surfaces of the interconnect site; and
an encapsulant deposited around the interconnect structure between the semiconductor die and substrate.

21. The semiconductor device of claim 20, wherein the interconnect structure is bonded to the interconnect site under pressure or reflow temperature.

22. The semiconductor device of claim 20, wherein a masking layer is formed over an area of the substrate away from the interconnect site.

23. The semiconductor device of claim 20, wherein the interconnect structure includes a bump or bump material.

24. The semiconductor device of claim 20, wherein the interconnect structure includes a fusible portion and non-fusible portion.

25. The semiconductor device of claim 20, wherein the interconnect structure includes a conductive pillar and bump formed over the conductive pillar.

26. A semiconductor device, comprising:
a substrate;
a conductive trace with an interconnect site disposed at an intermediate location along a length of the conductive trace formed over the substrate;
a plurality of individual non-conductive masking patches formed over an area of the substrate interstitial around and physically separated from the interconnect site; and
a semiconductor die including an interconnect structure formed over a surface of the semiconductor die with the interconnect structure covering a top surface and side surfaces of the interconnect site.

27. The semiconductor device of claim 26, wherein the interconnect structure is bonded to the interconnect site under pressure or reflow temperature.

28. The semiconductor device of claim 26, wherein a masking layer is formed over an area of the substrate away from the interconnect site.

29. The semiconductor device of claim 26, wherein the interconnect structure includes a bump or bump material.

30. The semiconductor device of claim 26, wherein the interconnect structure includes a fusible portion and non-fusible portion.

31. A semiconductor device, comprising:
a substrate;
a conductive trace including an interconnect site formed over the substrate, the interconnect site including a width substantially equal to a width of the conductive trace away from the interconnect site;
a plurality of individual non-conductive masking patches formed over an area of the substrate interstitial around and physically separated from the interconnect site; and
a semiconductor die including an interconnect structure disposed over the interconnect site.

32. The semiconductor device of claim 31, further including a plurality of asperities formed over the interconnect structure.

33. The semiconductor device of claim 31, further including an opening formed in the conductive trace.

34. The semiconductor device of claim 33, further including the interconnect structure disposed within the opening.

35. The semiconductor device of claim 31, wherein the interconnect structure includes a tip narrower than a body of the interconnect structure and the conductive trace deforms around the tip.

* * * * *